(12) United States Patent
Lee et al.

(10) Patent No.: US 12,543,413 B2
(45) Date of Patent: Feb. 3, 2026

(54) DISPLAY DEVICE AND METHOD OF FABRICATING THE SAME

(71) Applicant: Samsung Display Co., LTD., Yongin-si (KR)

(72) Inventors: Jong Chan Lee, Suwon-si (KR); Jin Taek Kim, Yongin-si (KR); Hyun Kim, Seoul (KR); Jeong Su Park, Asan-si (KR); Sok Ho Lee, Asan-si (KR); Woong Hee Jeong, Seoul (KR); Jung Eun Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 557 days.

(21) Appl. No.: 18/103,726

(22) Filed: Jan. 31, 2023

(65) Prior Publication Data

US 2023/0317883 A1 Oct. 5, 2023

(30) Foreign Application Priority Data

Apr. 1, 2022 (KR) .................. 10-2022-0040933

(51) Int. Cl.
*H10H 20/853* (2025.01)
*H10H 20/01* (2025.01)
*H10H 20/831* (2025.01)
*H10H 20/857* (2025.01)

(52) U.S. Cl.
CPC ........ *H10H 20/8312* (2025.01); *H10H 20/01* (2025.01); *H10H 20/853* (2025.01); *H10H 20/857* (2025.01); *H10H 20/032* (2025.01); *H10H 20/0364* (2025.01)

(58) Field of Classification Search
CPC .. H10H 20/8312; H10H 20/01; H10H 20/853; H10H 20/857; H10H 20/032; H10H 20/0364; H10H 20/8314; H10H 20/8316; H10H 20/832; H10H 20/852; H10H 20/855; H10H 20/882; H01L 25/0753; H10D 86/451; H10D 86/441
See application file for complete search history.

(56) References Cited

FOREIGN PATENT DOCUMENTS

KR 10-2009-0036373 4/2009

*Primary Examiner* — Monica D Harrison
*Assistant Examiner* — David M Helberg
(74) *Attorney, Agent, or Firm* — Womble Bond Dickinson (US) LLP

(57) ABSTRACT

A display device comprises a pad electrode disposed on a substrate, a pad electrode upper layer disposed on the pad electrode, a first pad electrode capping layer disposed on the pad electrode upper layer, a second pad electrode capping layer disposed on the first pad electrode capping layer, a protective layer disposed on the second pad electrode capping layer, and a capping layers disposed on the protective layer. The protective layer comprises a polymer resin and scattering particles. The protective layer comprises a first pad opening exposing the second pad electrode capping layer.

20 Claims, 16 Drawing Sheets

DISPLAY DEVICE AND METHOD OF FABRICATING THE SAME

CROSS-REFERENCE TO RELATED APPLICATION(S)

This application claims priority to and benefits of Korean Patent Application No. 10-2022-0040933 under 35 U.S.C. § 119, filed on Apr. 1, 2022 in the Korean Intellectual Property Office, the entire contents of which are incorporated herein by reference.

BACKGROUND

1. Technical Field

The disclosure relates to a display device and a method of fabricating the same.

2. Description of the Related Art

Display devices become more and more important as multimedia technology evolves. Accordingly, a variety of types of display devices such as organic light-emitting display (OLED) devices and liquid-crystal display (LCD) devices are currently used.

As a display device for displaying images, there is a self-luminous display device including light-emitting elements. Examples of such a self-luminous display device may include an organic light-emitting display device using an organic material as the light-emitting material for the light-emitting elements, or an inorganic light-emitting display device using an inorganic material as the light-emitting material for the light-emitting elements.

SUMMARY

Aspects of the disclosure provide a display device that can prevent damage to a pad area, and a method of fabricating a display device.

It should be noted that aspects of the disclosure are not limited to the above-mentioned aspect; and other aspects of the disclosure will be apparent to those skilled in the art from the following descriptions.

According to an embodiment of the disclosure, a display device may include a pad electrode disposed on a substrate, a pad electrode upper layer disposed on the pad electrode, a first pad electrode capping layer disposed on the pad electrode upper layer, a second pad electrode capping layer disposed on the first pad electrode capping layer, a protective layer disposed on the second pad electrode capping layer, and capping layers disposed on the protective layer. The protective layer may include a polymer resin and scattering particles. The protective layer may include a first pad opening exposing the second pad electrode capping layer.

In an embodiment, the substrate comprises a display area and a pad area spaced apart from the display area. The pad electrode may be disposed in the pad area.

In an embodiment, the display device may further include first and second electrodes that are disposed on the substrate in the display area and spaced apart from each other, a light-emitting element disposed on the first electrode and the second electrode, and a first connection electrode electrically connected to a first end of the light-emitting element and a second connection electrode electrically connected to a second end of the light-emitting element.

In an embodiment, the pad electrode upper layer, the first electrode, and the second electrode may include a same material. The first pad electrode capping layer and the first connection electrode may include a same material. The second pad electrode capping layer and the second connection electrode may include a same material.

In an embodiment, the display device may further include a transparent layer disposed on the first connection electrode and the second connection electrode and including a base resin and scattering particles. The capping layers may be disposed on the transparent layer.

In an embodiment, the base resin of the transparent layer and the polymer resin of the protective layer may include a same material. The scattering particles of the transparent layer and the scattering particles of the protective layer may include a same material.

In an embodiment, the first capping layer and the second capping layer may be extended from the display area to the pad area.

In an embodiment, the display device may further include a first insulating layer disposed between the pad electrode upper layer and the first pad electrode capping layer. The first insulating layer may include a first pad contact portion exposing the pad electrode upper layer. The first pad electrode capping layer may be in contact with the pad electrode upper layer via the first pad contact portion.

In an embodiment, the display device may further include a second insulating layer disposed between the first pad electrode capping layer and the second pad electrode capping layer. The second insulating layer may include a second pad contact portion that exposes the first pad electrode capping layer and overlaps the first pad contact portion. The second pad electrode capping layer may be in contact with the first pad electrode capping layer via the second pad contact portion.

In an embodiment, the first insulating layer may be disposed between the first and second electrodes and the light-emitting element. The second insulating layer may be disposed between the first connection electrode and the second connection electrode. The first insulating layer and the second insulating layer may be extended from the display area to the pad area.

In an embodiment, the capping layers may include a first capping layer disposed on the protective layer and a second capping layer disposed on the first capping layer. The first capping layer may include a second pad opening exposing the second pad electrode capping layer. The second capping layer may include a third pad opening exposing the second pad electrode capping layer.

In an embodiment, the second pad opening and the third pad opening may overlap the first pad opening.

In an embodiment, side surfaces of the protective layer, side surfaces of the first capping layer, and side surfaces of the second capping layer may be aligned with one another.

According to an embodiment of the disclosure, a method of fabricating a display device may include preparing a substrate comprising a display area and a pad area, forming a pad electrode on the substrate in the pad area, forming a first electrode and a second electrode on the substrate in the display area, forming a pad electrode upper layer on the pad electrode, forming a first insulating layer on the first electrode, the second electrode, and the pad electrode upper layer, forming a light-emitting element on the first electrode and the second electrode, forming a first connection electrode in contact with a first end of the light-emitting element, forming a first pad electrode capping layer on the pad electrode upper layer, forming a second insulating layer on the first connection electrode and the first pad electrode capping layer, forming a second connection electrode in contact with a second end of the light-emitting element, forming a second pad electrode capping layer on the first pad electrode capping layer, forming a transparent layer on the second connection electrode and forming a protective layer on the second pad electrode capping layer, forming a first capping layer on the transparent layer and the protective layer, and forming a second capping layer on the first capping layer.

In an embodiment, the transparent layer and the protective layer may be formed simultaneously by applying a coating solution containing a polymer resin and scattering particles dispersed in the polymer resin and patterning the coating solution.

In an embodiment, the method may further include, after the forming of the first insulating layer, forming a first pad contact portion exposing the pad electrode upper layer by etching the first insulating layer.

In an embodiment, the method may further include after the forming of the second insulating layer, forming a second pad contact portion exposing the first pad electrode capping layer by etching the second insulating layer.

In an embodiment, the method may further include, after the forming of the first capping layer, forming a first pad opening and a second pad opening exposing the second pad electrode capping layer by etching the protective layer and the first capping layer altogether.

In an embodiment, the second capping layer may cover the first capping layer. The second capping payer may cover the protective layer and the second pad electrode capping layer through the first pad opening and the second pad opening.

In an embodiment, the method may further include, after the forming of the second capping layer, forming a third pad opening exposing the second pad electrode capping layer by etching the second capping layer.

According to embodiments of the disclosure, by forming a protective layer, a first capping layer and a second capping layer in a pad area, it may be possible to prevent problems, such as galvanic corrosion, from occurring in electrodes disposed in the pad area by a developer during the processes.

According to embodiments of the disclosure, by forming the protective layer including a first pad opening in the pad area, there may be an advantage in that conductive balls can be readily disposed in the first pad opening.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
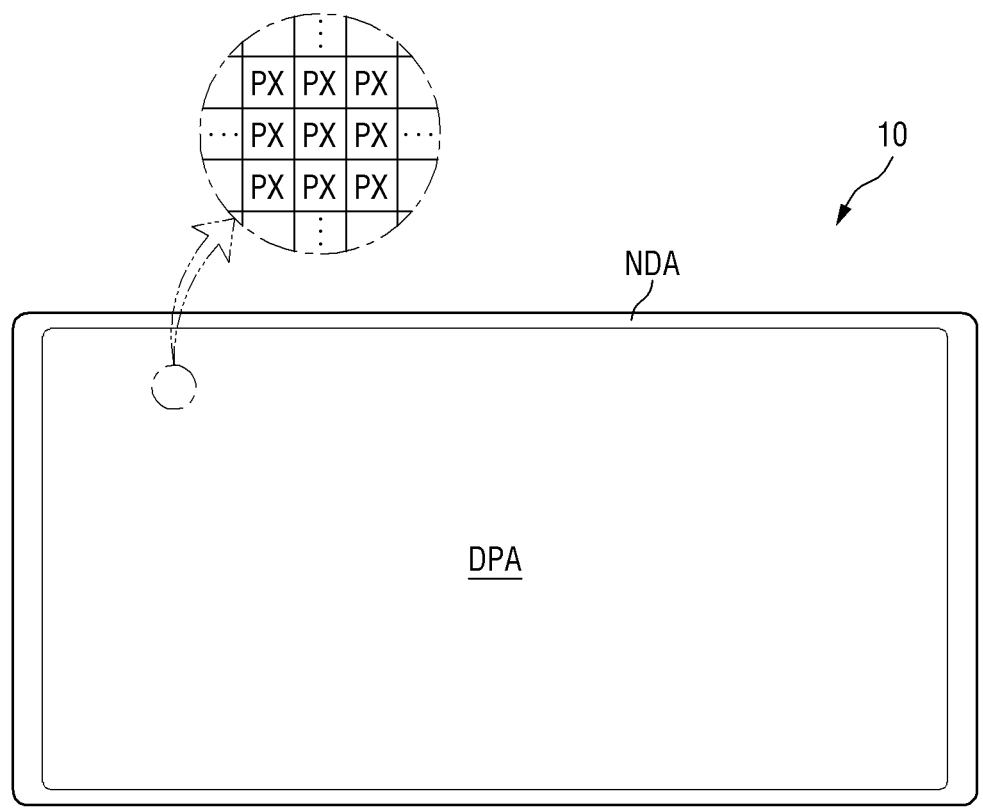
FIG. 1 is a schematic plan view of a display device according to an embodiment of the disclosure.
Figure 1:
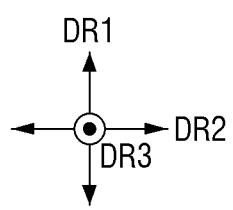

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment of the disclosure.

Referring to FIG. 1, the display device 10 displays a moving image or a still image. A display device 10 may refer to any electronic device that provides a display screen. For example, the display device 10 may include a television set, a laptop computer, a monitor, an electronic billboard, Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Any other display panel may be employed as long as the disclosure can be applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. In the example shown in FIG. 1, the display device 10 has a rectangular shape with the longer sides in a second direction DR2.

The display device 10 may include a display area DPA and a non-display area NDA. In the display area DPA, images can be displayed. In the non-display area NDA, images may not be displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged in a matrix. The shape of each pixel PX may be, but is not limited to, a rectangle or a square in a plan view. Each pixel may have a diamond shape having sides inclined with respect to a direction. The pixels PX may be arranged in stripes or in a pattern of islands. Each of the pixels PX may include at least one light-emitting element that emits light of a particular wavelength band to represent a color.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
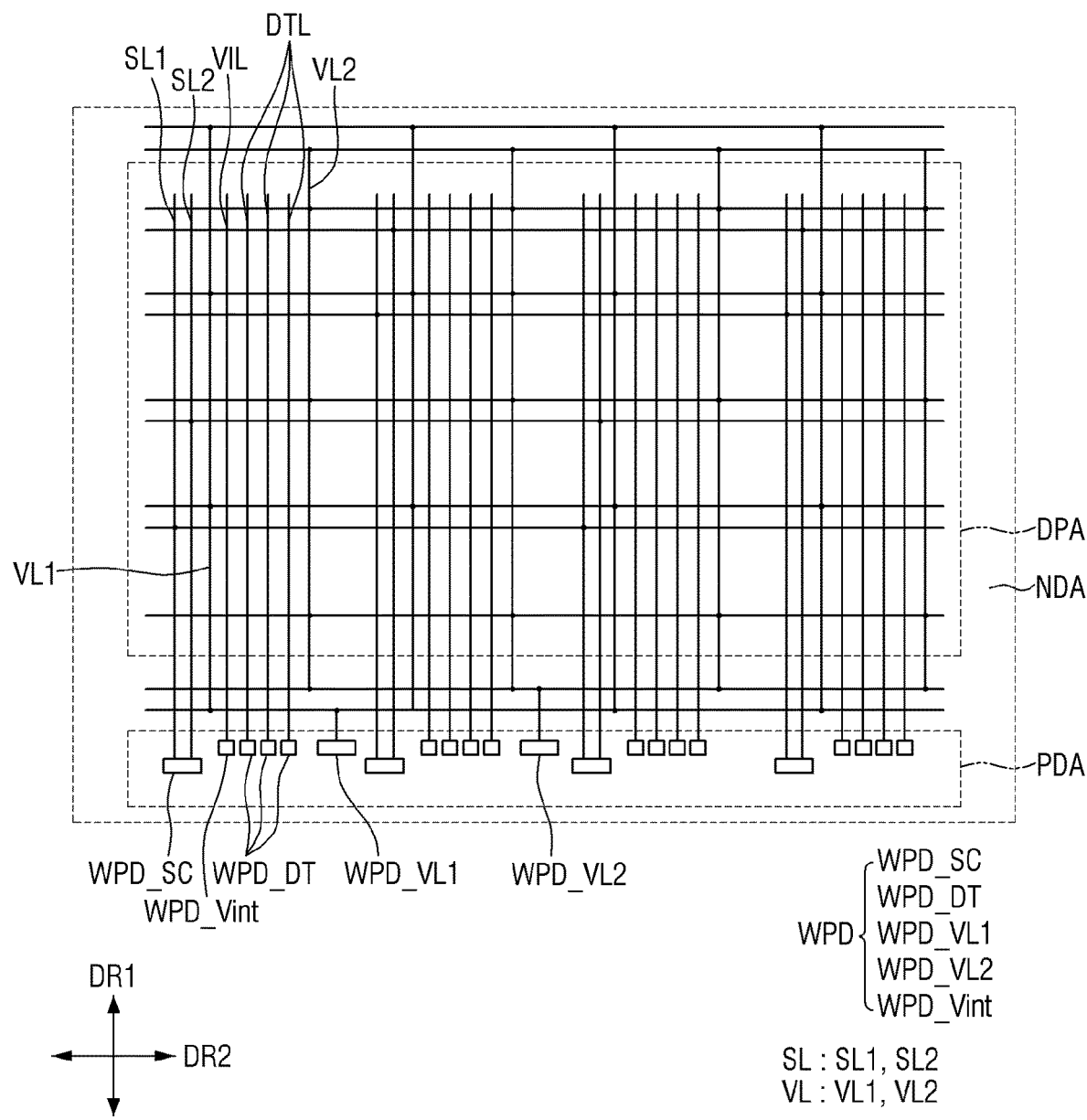
FIG. 2 is a view schematically showing arrangements of lines in a display device according to an embodiment of the disclosure.

FIG. 2 is a view schematically showing arrangements of lines in a display device according to an embodiment of the disclosure.

Referring to FIG. 2, the display device 10 may include lines. The lines may include scan lines SL: SL1, SL2, data lines DTL, an initialization voltage line VIL, and voltage lines VL: VL1 and VL2. Although not shown in the drawings, other lines may be further disposed in the display device 10. The scan lines SL may be extended in the first direction DR1. The scan lines SL may be connected to scan line pads WPD_SC connected to a scan driver (not shown). The scan lines SL may be extended from a pad area PDA located in the non-display area NDA to the display area DPA.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

The data lines DTL may be extended in the first direction DR1. The data lines DTL may include units of three data lines DTL adjacent to one another. The data lines DTL may be extended from the pad area PDA located in the non-display area NDA to the display area DPA.

The initialization voltage line VIL may also be extended in the first direction DR1. The initialization voltage line VIL may be disposed between the data lines DTL and the scan line SL. The initialization voltage line VIL may be extended from the pad area PDA located in the non-display area NDA to the display area DPA.

A first voltage line VL1 and a second voltage line VL2 may include portions extended in the first direction DR1 and portions extended in the second direction DR2. The portions of the first voltage line VL1 and the second voltage line VL2 which are extended in the first direction DR1 may traverse the display area DPA. The portions of the voltage line VL1 and the second voltage line VL2 which are extended in the second direction DR2 may be disposed in the display area DPA and may be partially disposed in the non-display area NDA located on the sides of the display area DPA in the first direction DR1. The first voltage line VL1 and the second voltage line VL2 may have a mesh structure on the entire display area DPA.

The scan lines SL, the data lines DTL, the initialization voltage line VIL, the first voltage line VL1 and the second voltage line VL2 may be electrically connected to at least one wire pad WPD. The wire pads WPD may be disposed in the non-display areas NDA. The wire pads WPD may be disposed in the pad area PDA located on the lower side of the display area DPA that may be the opposite side in the first direction DR1, but the disclosure is not limited thereto. The position of the pad area PDA may vary depending on the size and the specifications of the display device 10. The scan lines SL may be connected to the scan wire pad WPD_SC disposed in the pad area PDA, and the data lines DTL may be connected to different data wire pads WPD_DT, respectively. The initialization voltage line VIL may be connected to the initialization wiring pad WPD_Vint, the first voltage line VL1 may be connected to a first voltage wire pad WPD_VL1, and the second voltage line VL2 may be connected to the second voltage wire pad WPD_VL2. External devices may be mounted on the wire pads WPD. External devices may be mounted on the wire pads WPD by an anisotropic conductive film, ultrasonic bonding, etc. Although the wire pads WPD are disposed in the pad area PDA located on the lower side of the display area DPA in the drawings, the disclosure is not limited thereto. Some of the wire pads WPD may be disposed on the upper side or on the left and/or right sides of the display area DPA.

Each of the pixels PX or sub-pixels SPXn of the display device 10 may include a pixel driving circuit, where n may be an integer of 1 to 3. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. According to an embodiment of the disclosure, each of the sub-pixels SPXn of the display device 10 may have a 3T1C structure, i.e., a pixel driving circuit includes three transistors and one capacitor. In the following description, the pixel driving circuit having the 3T1C structure will be described as an example. It is, however, to be understood that the disclosure is not limited thereto. A variety of modified pixel structures may be employed such as a 2T1C structure, a 7T1C structure and a 6T1C structure.

Figure 3:
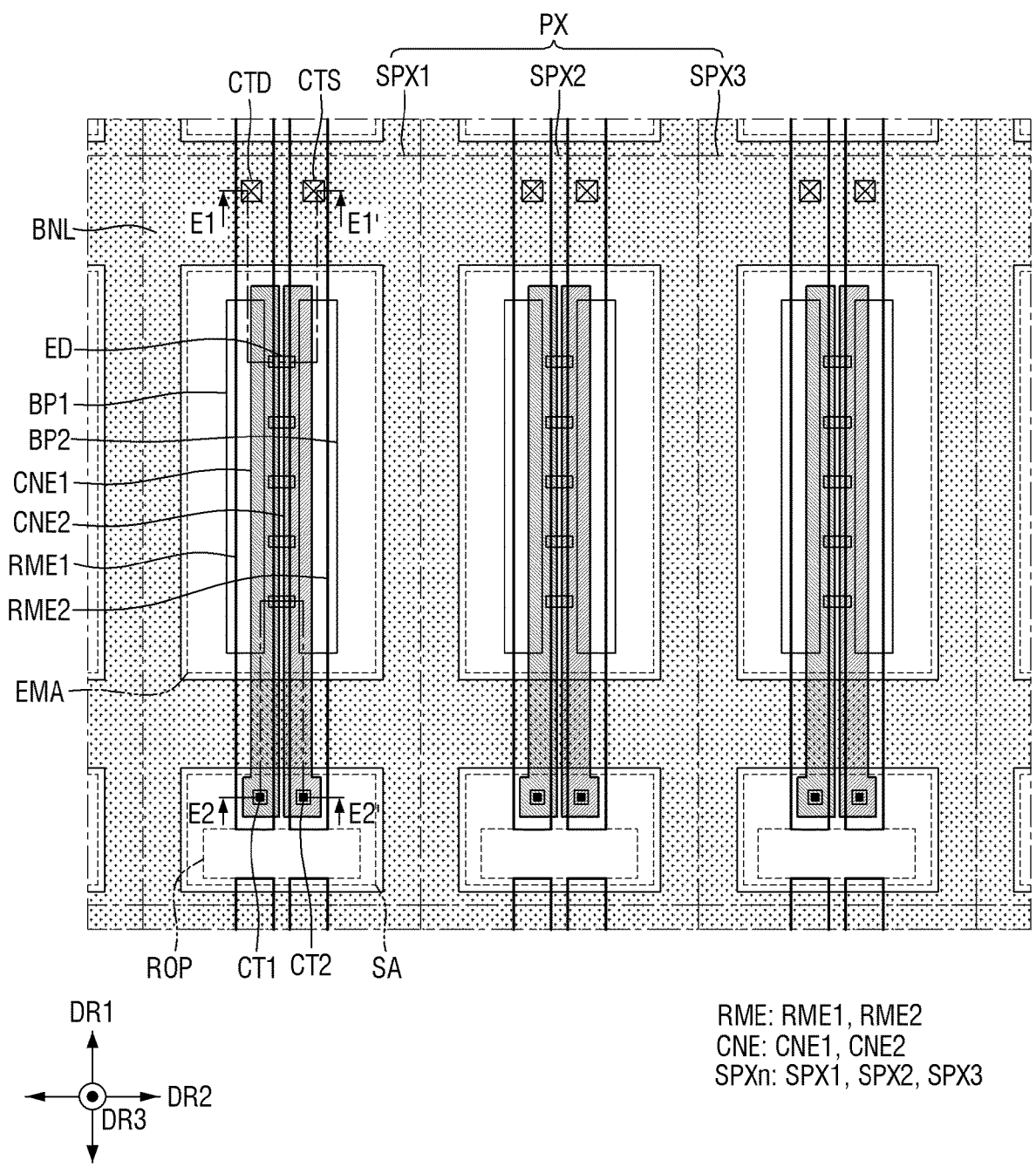
FIG. 3 is a schematic plan view showing a pixel of a display device according to an embodiment of the disclosure.

FIG. 3 is a schematic plan view showing a pixel of a display device according to an embodiment of the disclosure. FIG. 3 shows a layout of electrodes RME: RME1 and RME2, bank patterns BP1 and BP2, a bank layer BNL, light-emitting elements ED, and connection electrodes CNE: CNE1 and CNE2 in a plan view.

Referring to FIG. 3, each of the pixels PX of the display device 10 may include sub-pixels SPXn. For example, a pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be red, the second color may be green, and the third color may be blue. It is, however, to be understood that the disclosure is not limited thereto. All the sub-pixels SPXn may emit light of the same color. According to an embodiment of the disclosure, the sub-pixels SPXn may emit blue light. Although the single pixel PX includes three sub-pixels SPXn in the example shown in the drawings, the disclosure is not limited thereto. For example, the pixel PX may include more than three sub-pixels SPXn.

Each of the sub-pixels SPXn of the display device 10 may include an emission area EMA and a non-emission area. In the emission area EMA, light-emitting diodes ED may be disposed to emit light of a particular wavelength band. In the non-emission area, the light-emitting diodes ED may not be disposed and the light emitted from the light-emitting diodes ED may not reach, and thus no light exits therefrom.

The emission area EMA may include an area in which the light-emitting elements ED are disposed, and may include an area adjacent to the light-emitting elements ED where lights emitted from the light-emitting elements ED exit. For example, the emission area EMA may also include an area in which lights emitted from the light-emitting elements ED may be reflected or refracted by other elements to exit. The light-emitting elements ED may be disposed in each of the sub-pixels SPXn, and the emission area may include the area where the light-emitting elements may be disposed and the adjacent area.

Although the emission areas EMA of the sub-pixels SPXn have the uniform area in the example shown in the drawings, the disclosure is not limited thereto. In some embodiments, the emission areas EMA of the sub-pixels SPXn may have different areas depending on a color or wavelength band of light emitted from the light-emitting diodes ED disposed in the respective sub-pixels.

Each of the sub-pixels SPXn may further include a subsidiary area SA disposed in the non-emission area. The subsidiary area SA of each sub-pixel SPXn may be disposed on the lower side of the emission area EMA that may be the opposite side in the first direction DR1. The emission areas EMA and the subsidiary areas SA may be arranged alternately in the first direction DR1, and each subsidiary area SA may be disposed between the emission areas EMA of different sub-pixels SPXn spaced apart from each other in the first direction DR1. For example, the emission areas EMA and the subsidiary areas SA may be alternately arranged in the first direction DR1, and the emission areas EMA and the subsidiary areas SA may be repeatedly arranged in the second direction DR2. It is, however, to be understood that the disclosure is not limited thereto. The emission areas EMA and the subsidiary areas SA of the pixels PX may have a layout different from that of FIG. 3.

No light-emitting diode ED may be disposed in the subsidiary areas SA and thus no light exits therefrom. The electrodes RME disposed in the sub-pixels SPXn may be partially disposed in the subsidiary areas SA. The electrodes RME disposed in different sub-pixels SPXn may be disposed separately from one another at separation regions ROP of the subsidiary areas SA.

The display device 10 may include electrodes RME: RME1 and RME2, bank patterns BP1 and BP2, a bank layer BNL, light-emitting elements ED, and connection electrodes CNE: CNE1 and CNE2.

The bank patterns BP1 and BP2 may be disposed in the emission area EMA of each sub-pixel SPX. Each of the bank patterns BP1 and BP2 may have a shape that has a constant width in the second direction DR2 and may be extended in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side of the center of the emission area EMA that may be one side in the second direction DR2, and the second bank pattern BP2 may be spaced apart from the first bank pattern BP1 and may be disposed on the right side of the center of the emission area EMA that may be the opposite side in the second direction DR2. The first bank pattern BP1 and the second bank pattern BP2 may be alternately arranged along the second direction DR2 and may be disposed in an island-like pattern in the display area DPA. The light-emitting elements ED may be disposed between the first bank pattern BP1 and the second bank pattern BP2.

The length of the first bank pattern BP1 may be equal to the length of the second bank pattern BP2 in the first direction DR1. The lengths of the first bank pattern BP1 and the second bank pattern BP2 may be smaller than the length of the emission area EMA surrounded by the bank layer BNL in the first direction DR1. The first bank pattern BP1 and the second bank pattern BP2 may be spaced apart from a portion of the bank layer BNL that may be extended in the second direction DR2. It should be understood, however, that the disclosure is not limited thereto. The bank patterns BP1 and BP2 may be integrated with the bank layer BNL or may partially overlap a portion of the bank layer BNL that may be extended in the second direction DR2. The lengths of the bank patterns BP1 and BP2 in the first direction DR1 may be equal to or greater than the length of the emission area EMA surrounded by the bank layer BNL in the first direction DR1.

The first bank pattern BP1 and the second bank pattern BP2 may have the same width in the second direction DR2. It should be understood, however, that the disclosure is not limited thereto. The first bank pattern BP1 and the second bank pattern BP2 may have different widths. For example, one of the bank patterns may have a greater width than another one, and the larger bank pattern may be disposed across the emission areas EMA of different sub-pixels SPXn adjacent to each other in the second direction DR2. In case that the bank patterns are disposed across the emission areas EMA, portions of the bank layer BNL extended in the first direction DR1 may overlap the second bank pattern BP2 in the thickness direction. Although two bank patterns BP1 and BP2 are disposed in each sub-pixel SPXn and have the same width in the example shown in the drawings, the disclosure is not limited thereto. The number and shape of the bank patterns BP1 and BP2 may vary depending on the number or arrangement structure of the electrodes RME.

The electrodes RME: RME1 and RME2 have a shape extended in a direction and are disposed in each of the sub-pixels SPXn. The electrodes RME1 and RME2 may be extended in the first direction DR1 to be disposed in the emission area EMA and the subsidiary area SA of the sub-pixel SPXn, and they may be spaced apart from one another in the second direction DR2. The electrodes RME may be electrically connected to the light-emitting elements ED, which will be described later. It should be understood, however, that the disclosure is not limited thereto. The electrodes RME may not be electrically connected to the light-emitting elements ED.

The display device 10 may include a first electrode RME1 and a second electrode RME2 disposed in each of the sub-pixels SPXn. The first electrode RME1 may be disposed on the left side of the center of the emission area EMA, and the second electrode RME2 may be spaced apart from the first electrode RME1 in the second direction DR2 and may be disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may be extended beyond the bank layer BNL and may be partially disposed in the sub-pixel SPXn and the subsidiary area SA. The first electrode RME1 and the second electrode RME2 of a sub-pixel SPXn may be spaced apart from those of another sub-pixel SPXn at the separation region ROP located in the subsidiary area SA of one of the sub-pixels SPXn.

Although two electrodes RME are disposed in each sub-pixel SPXn and have a shape extended in the first direction DR1 in the drawings, the disclosure is not limited thereto. For example, more than two electrodes RME may be disposed in a single sub-pixel SPXn of the display device 10, or the electrodes RME may be partially bent and may have varying widths in a direction.

The bank layer BNL may be disposed to surround the sub-pixels SPXn, the emission area EMA and the subsidiary area SA. The bank layer BNL may be disposed at the boundary between the sub-pixels SPXn adjacent to each other in the first direction DR1 and the second direction DR2, and may also be disposed at the boundary between the emission area EMA and the subsidiary area SA. The sub-pixels SPXn, the emission areas EMA and the subsidiary areas SA of the display device 10 may be distinguished from one another by the bank layer BNL. The distance between the sub-pixels SPXn, the emission areas EMA and the subsidiary areas SA may vary depending on the width of the bank layer BNL.

The bank layer BNL may be disposed in a lattice pattern on the front surface of the display area DPA including portions extended in the first direction DR1 and the second direction DR2 in a plan view. The bank layer BNL may be disposed along the border of each of the sub-pixels SPXn to distinguish between adjacent sub-pixels SPXn. The bank layer BNL may be disposed to surround the emission area EMA and the subsidiary area SA disposed in each of the sub-pixels SPXn to distinguish between the emission area EMA and the subsidiary area.

The light-emitting elements ED may be disposed in the emission area EMA. The light-emitting elements ED may be disposed between the bank patterns BP1 and BP2 and may be spaced apart from one another in the first direction DR1. According to an embodiment of the disclosure, the light-emitting elements ED may have a shape extended in a direction, and the ends to light-emitting elements ED may be disposed on different electrodes RME, respectively. The length of the light-emitting elements ED may be larger than the distance between the electrodes RME spaced apart from each other in the second direction DR2. The direction in which the light-emitting elements ED are generally extended may be perpendicular to the first direction DR1 in which the electrodes RME are extended. It is, however, to be understood that the disclosure is not limited thereto. The direction in which the light-emitting elements ED are extended may face the second direction DR2 or a direction obliquely thereto.

The connection electrodes CNE; CNE1 and CNE2 may be disposed on the electrodes RME and the bank patterns BP1 and BP2. The connection electrodes CNE may each have a shape extended in a direction and may be spaced apart from one another. Each of the connection electrodes CNE may be in contact with the light-emitting elements ED and may be electrically connected to the electrodes RME or a conductive layer thereunder.

The connection electrodes CNE may include a first connection electrode CNE1 and a second connection electrode CNE2 disposed in each sub-pixel SPXn. The first connection electrode CNE1 may have a shape extended in the first direction DR1 and may be disposed on the first electrode RME1 or the first bank pattern BP1. The first connection electrode CNE1 may partially overlap the first electrode RME1 and may be disposed from the emission area EMA to the subsidiary area SA beyond the bank layer BNL. The second connection electrode CNE2 may have a shape extended in the first direction DR1 and may be disposed on the second electrode RME2 or the second bank pattern BP2. The second connection electrode CNE2 may partially overlap the second electrode RME2 and may be disposed from the emission area EMA to the subsidiary area SA beyond the bank layer BNL.

Figure 4:
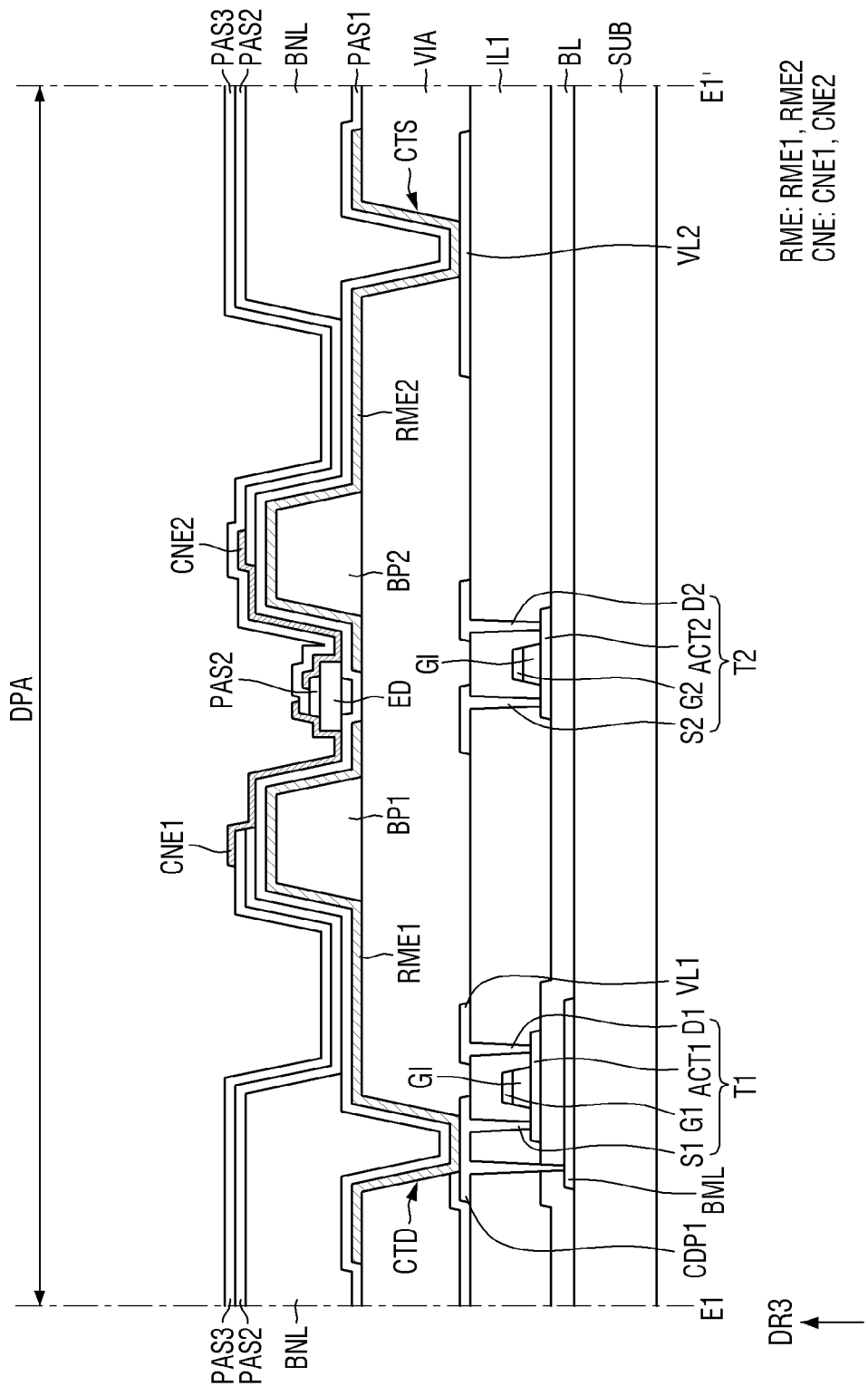
FIG. 4 is a schematic cross-sectional view taken along line E1-E1' of FIG. 3.
Figure 5:
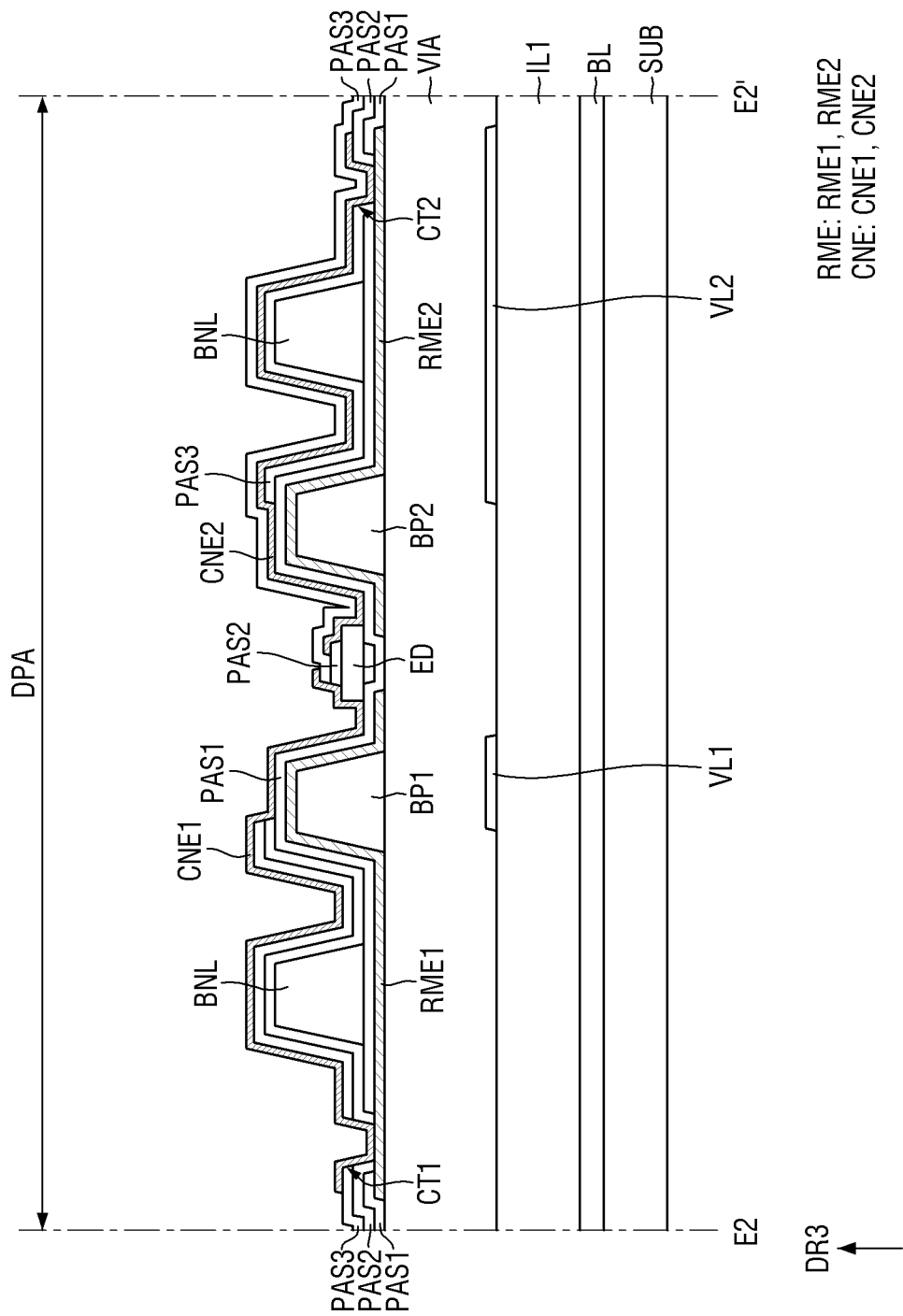
FIG. 5 is a schematic cross-sectional view taken along line E2-E2' of FIG. 3.

FIG. 4 is a schematic cross-sectional view taken along line E1-E1' of FIG. 3. FIG. 5 is a schematic cross-sectional view taken along line E2-E2' of FIG. 3.

FIG. 4 shows a cross section passing through the ends of the light-emitting elements ED disposed in the first sub-pixel SPX1 and electrode contact holes CTD and CTS; and FIG. 5 shows a cross section passing through the ends of the light-emitting elements ED disposed in the first sub-pixel SPXn and contacts CT1 and CT2.

Referring to FIGS. 3 to 5, the cross-sectional structure of the display device 10 will be described. The display device 10 may include a first substrate SUB, and a semiconductor layer, conductive layers and insulating layers disposed on the first substrate SUB. The display device 10 may include electrodes RME: RME1 and RME2, light-emitting elements ED, and connection electrodes CNE: CNE1 and CNE2. The semiconductor layer, the conductive layers and the insulating layers may form a circuit layer CCL (see FIG. 7) of the display device 10.

The substrate SUB may be an insulating substrate. The substrate SUB may be made of an insulating material such as glass, quartz and/or a polymer resin. The substrate SUB may be either a rigid substrate or a flexible substrate that can be bent, folded, and/or rolled. The substrate SUB may include the display area DPA and the non-display area NDA surrounding the display area DPA. The display area DPA may include the emission area EMA and the subsidiary area SA which may be a portion of the non-emission area.

A first conductive layer may be disposed on the substrate SUB. The first conductive layer may include a bottom metal layer BML. The bottom metal layer BML may be disposed to overlap an active layer ACT1 of a first transistor T1. The bottom metal layer BML may prevent light from being incident on the first active layer ACT1 of the first transistor or may be electrically connected to the first active layer ACT1 to stabilize the electrical characteristics of the first transistor T1. It is, however, to be noted that the bottom metal layer BML may be eliminated.

A buffer layer BL may be disposed on the bottom metal layer BML and the substrate SUB. The buffer layer BL may be formed on the substrate SUB to protect the transistors of the pixels PX from moisture permeating through the substrate SUB that may be susceptible to moisture permeation, and may also provide a flat surface.

The semiconductor layer may be disposed on the buffer layer BL. The semiconductor layer may include the first active layer ACT1 of the first transistor T1 and the second active layer ACT2 of the second transistor T2. The first active layer ACT1 and the second active layer ACT2 may be disposed to partially overlap the first gate electrode G1 and the second gate electrode G2 of a second conductive layer, respectively, which will be described later.

The semiconductor layer may include polycrystalline silicon, monocrystalline silicon, an oxide semiconductor, etc., or a combination thereof. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium-gallium zinc tin oxide (IGZTO).

Although the first transistor T1 and the second transistor T2 are disposed in the sub-pixel SPXn of the display device 10 in the drawings, the disclosure is not limited thereto. A larger number of transistors may be included in the display device 10.

A first gate insulator GI may be disposed on the semiconductor layer in the display area DPA. The first gate insulator GI may work as a gate insulating film of the transistors T1 and T2. In the example shown in the drawings, the first gate insulator GI may be patterned together with the gate electrodes G1 and G2 of the second conductive layer to be described later, and may be partially disposed between the second conductive layer and the active layers ACT1 and ACT2 of the semiconductor layer. It is, however, to be understood that the disclosure is not limited thereto. In some embodiments, the first gate insulator GI may be disposed entirely on the buffer layer BL.

The second conductive layer may be disposed on the first gate insulator GI. The second conductive layer may include a first gate electrode G1 of the first transistor T1, and a second gate electrode G2 of the second transistor T2. The first gate electrode G1 may overlap a channel region of the first active layer ACT1 in the third direction DR3, which may be the thickness direction. The second gate electrode G2 may overlap a channel region of the second active layer ACT2 in the third direction DR3, which may be the thickness direction.

A first interlayer dielectric layer IL1 may be disposed on the second conductive layer. The first interlayer dielectric layer IL1 may work as an insulating film between the second conductive layer and other layers disposed thereon and can protect the second conductive layer.

The third conductive layer may be disposed on the first interlayer dielectric layer IL1 The third conductive layer may include the first voltage line VL1 and the second voltage line VL2 disposed in the display area DPA, a first conductive pattern CDP1, and the source electrodes S1 and S2 and drain electrodes D1 and D2 of the transistors T1 and T2.

A high-level voltage (or a first supply voltage) may be applied to the first voltage line VL1 to be transmitted to the first electrode RME1, and a low-level voltage (or a second supply voltage) may be applied to the second voltage line VL2 to be transmitted to the second electrode RME2. A portion of the first voltage line VL1 may be in contact with the first active layer ACT1 of the first transistor T1 through a contact hole penetrating the first interlayer dielectric layer ILL The first voltage line VL1 may work as the first drain electrode D1 of the first transistor T1. The second voltage line VL2 may be directly connected to the second electrode RME2 to be described later.

The first conductive pattern CDP1 may be in contact with the first active layer ACT1 of the first transistor T1 through a contact hole penetrating the first interlayer dielectric layer IL1. The first conductive pattern CDP1 may be in contact with the bottom metal layer BML through another contact hole penetrating the first interlayer dielectric layer IL1 and the buffer layer BL. The first conductive pattern CDP1 may work as a first source electrode S1 of the first transistor T1. The first conductive pattern CDP1 may be connected to a first electrode RME1 or a first connection electrode CNE1 to be described later. The first transistor T1 may transfer the first supply voltage applied from the first voltage line VL1 to the first electrode RME1 or the first connection electrode CNE1.

Each of the second source electrode S2 and the second drain electrode D2 may be in contact with the second active layer ACT2 of the second transistor T2 through contact holes penetrating the first interlayer dielectric layer IL1.

The buffer layer BL, the first gate insulator GI and the first interlayer dielectric layer IL1 may be made up of multiple inorganic layers stacked on one another alternately. For example, the buffer layer BL, the first gate insulating layer GI and the first interlayer dielectric layer IL1 may be made up of a double layer in which inorganic layers including at least one of silicon oxide (SiOx), silicon nitride (SiNx) and silicon oxynitride (SiON) are stacked on one another or multiple layers in which they are alternately stacked on one another. It is, however, to be understood that the disclosure is not limited thereto. The buffer layer BL, the first gate insulating layer GI and the first interlayer dielectric layer IL1 may be made up of a single inorganic layer including the above-described insulating material. In some embodiments, the first interlayer dielectric layer IL1 may be made of an organic insulating material such as polyimide (PI).

A via layer VIA may be disposed on the third conductive layer in the display area DPA. The via layer VIA may include an organic insulating material, e.g., an organic insulating material such as polyimide (PI), to provide a flat surface over the underlying conductive layers having different heights. It should be noted that the via layer VIA may be eliminated in some implementations.

The display device 10 may include the bank patterns BP1 and BP2, the electrodes RME: RME1 and RME2, the bank layer BNL, the light-emitting elements ED, and the connection electrodes CNE: CNE1 and CNE2 as a display element layer disposed on the via layer VIA. The display device 10 may include insulating layers PAS1, PAS2, PAS3 and PAS4 disposed on the via layer VIA.

The bank patterns BP1 and BP2 may be disposed on the via layer VIA. For example, the bank patterns BP1 and BP2 may be disposed directly on the via layer VIA, and may have a structure that at least partly protrudes from the upper surface of the via layer VIA. The protruding portions of the bank patterns BP1 BP2 may have inclined side surfaces or bent side surfaces with a curvature. The lights emitted from the light-emitting elements ED may be reflected by the electrodes RME disposed on the bank patterns BP1 and BP2 so that the lights may exit toward the upper side of the via layer VIA. Unlike that shown in the drawings, the bank patterns BP1 and BP2 may have a shape with a bent outer surface with a curvature, e.g., a semi-circular or semi-elliptical shape in the cross-sectional view. The bank patterns BP1 and BP2 may include, but are not limited to, an organic insulating material such as polyimide (PI).

The electrodes RME; RME1 and RME2 may be disposed on the bank patterns BP1 and BP2 and the via layer VIA. For example, the first electrode RME1 and the second electrode RME2 may be disposed on at least inclined side surfaces of the bank patterns BP1 and BP2. The width of the electrodes RME measured in the second direction DR2 may be smaller than the width of the bank patterns BP1 and BP2 measured in the second direction DR2. The distance between the first electrode RME1 and the second electrode RME2 spaced apart from each other in the second direction DR2 may be smaller than the distance between the bank patterns BP1 and BP2. At least a portion of the first electrode RME1 and the second electrode RME2 may be disposed directly on the via layer VIA, so that they may be disposed on the same plane.

The light-emitting elements ED disposed between the bank patterns BP1 and BP2 may emit lights through the ends. The emitted lights may be directed to the electrodes RME disposed on the bank patterns BP1 and BP2. The portion of each of the electrodes RME that may be disposed on the bank patterns BP1 and BP2 may reflect lights emitted from the light-emitting elements ED. The first electrodes RME1 and the second electrodes RME2 may be disposed to cover the side surfaces of the bank patterns BP1 and BP2 on at least one side to reflect lights emitted from the light-emitting elements ED.

Each of the electrodes RME may be in direct contact with the third conductive layer through the electrode contact holes CTD and CTS where the electrodes overlap the bank layer BNL between the emission area EMA and the subsidiary area SA. The first electrode contact hole CTD may be formed where the bank layer BNL and the first electrode RME1 overlap each other. The second electrode contact hole CTS may be formed where the bank layer BNL and the second electrode RME2 overlap each other. The first electrode RME1 may be in contact with the first conductive pattern CDP1 through the first electrode contact hole CTD penetrating through the via layer VIA. The second electrode RME2 may be in contact with the second voltage line VL2 through the second contact hole CTS penetrating through the via layer VIA. The first electrode RME1 may be electrically connected to the first transistor T1 through the first conductive pattern CDP1 to receive the first supply voltage. The second electrode RME2 may be electrically connected to the second voltage line VL2 to receive the second supply voltage. It is, however, to be understood that the disclosure is not limited thereto. According to another embodiment, each of the electrodes RME1 and RME2 may not be electrically connected to the voltage lines VL1 and VL2 of the third conductive layer and connection electrodes CNE to be described later may be directly connected to the third conductive layer.

Each of the electrodes RME may include a conductive material having a high reflectance. For example, the electrodes RME may include a metal such as silver (Ag), copper (Cu) and aluminum (Al), or may include an alloy including aluminum (Al), nickel (Ni), lanthanum (La), or the like, or a stack of a metal layer such as titanium (Ti), molybdenum (Mo) and niobium (Nb) and the alloy, or combinations thereof. In some embodiments, the electrodes RME may be made up of a double- or multi-layer in which an alloy containing aluminum (Al) and at least one metal layer made of titanium (Ti), molybdenum (Mo) and/or niobium (Nb) are stacked on one another.

It is, however, to be understood that the disclosure is not limited thereto. The electrodes RME may further include a transparent conductive material. For example, each of the electrodes RME may include a material such as ITO, IZO and/or ITZO. In some embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure such as ITO/Ag/ITO/, ITO/Ag/IZO, or ITO/Ag/ITZO/IZO. The electrodes RME may be electrically connected to the light-emitting elements ED and may reflect some of the lights emitted from the light-emitting elements ED toward the upper side of the substrate SUB.

The first insulating layer PAS1 may be disposed on the front surface of the display area DPA, and may be disposed on the via layer VIA and the electrodes RME. The first insulating layer PAS1 may include an insulating material, and can protect the electrodes RME and can insulate different electrodes RME from each other. As the first insulating layer PAS1 may be disposed to cover the electrodes RME before the bank layer BNL may be formed, it may be possible to prevent the electrode RME from being damaged during the process of forming the bank layer BNL. The first insulating layer PAS1 can also prevent that the light-emitting diodes ED disposed thereon are brought into contact with other elements and damaged.

In an embodiment, the first insulating layer PAS1 may have steps so that a portion of the upper surface may be recessed between the electrodes RME spaced apart from one another in the second direction DR2. The light-emitting diodes ED may be disposed at the steps of the upper surface of the first insulating layer PAS1, and space may be formed between the light-emitting diodes ED and the first insulating layer PAS1.

The first insulating layer PAS1 may include contacts CT1 and CT2 disposed in the subsidiary area SA. The contacts CT1 and CT2 may be disposed to overlap different electrodes RME, respectively. For example, the contacts CT1 and CT2 may include first contacts CT1 disposed to overlap the first electrode RME1, and second contacts CT2 disposed to overlap the second electrode RME2. The first contacts CT1 and the second contacts CT2 may penetrate the first insulating layer PAS1 to expose a portion of the upper surface of the first electrode RME1 or the second electrode RME2 disposed thereunder. Each of the first contact CT1 and the second contact CT2 may further penetrate some of the other insulating layers disposed on the first insulating layer PAS1. The electrodes RME exposed by the contacts CT1 and CT2 may be in contact with the connection electrodes CNE.

The bank layer BNL may be disposed on the first insulating layer PAS1. The bank layer BNL may include portions extended in the first direction DR1 and the second direction DR2 and may surround each of the sub-pixels SPXn. The bank layer BNL may surround the emission area EMA and the subsidiary area SA of each of the sub-pixels SPXn to distinguish between the emission area EMA and the subsidiary area SA, and may surround the border of the display area DPA to distinguish between the display area DPA and the non-display area NDA.

The bank layer BNL may have a height similar to the bank patterns BP1 and BP2. In some embodiments, the top surface of the bank layer BNL may have a height higher than that of the bank patterns BP1 and BP2, and the thickness thereof may be equal to or greater than the thicknesses of the bank patterns BP1 and BP2. The bank layer BNL can prevent an ink from overflowing into adjacent sub-pixels SPXn during an inkjet printing process of the process of fabricating the display device 10. The bank layer BNL may include an organic insulating material such as polyimide, like the bank patterns BP1 and BP2.

The light-emitting elements ED may be disposed in the emission area EMA. The light-emitting elements ED may be disposed on the first insulating layer PAS1 between the bank patterns BP1 and BP2. The direction in which the light-emitting elements ED are extended may be parallel to the upper surface of the substrate SUB. As will be described later, the light-emitting elements ED may include semiconductor layers arranged in the extended direction. The semiconductor layers may be sequentially arranged along a direction parallel to the upper surface of the substrate SUB. It should be understood, however, that the disclosure is not limited thereto. In case that the light-emitting elements ED have a different structure, semiconductor layers may be disposed in a direction perpendicular to the substrate SUB.

The light-emitting elements ED disposed in each of the sub-pixels SPXn may emit light of different wavelength bands depending on the material of the semiconductor layer. It is, however, to be understood that the disclosure is not limited thereto. The light-emitting elements ED disposed in each of the sub-pixels SPXn may include the semiconductor layers made of the same material and may emit light of the same color.

The light-emitting elements ED may be electrically connected to the electrodes RME and the conductive layers under the via layer VIA in contact with the connection electrodes CNE: CNE1 and CNE2, and an electric signal may be applied to a light-emitting element ED so that light of a particular wavelength range can be emitted.

The second insulating layer PAS2 may be disposed on the light-emitting elements ED, the first insulating layer PAS1 and the bank layer BNL. The second insulating layer PAS2 may be extended in the first direction DR1 between the bank patterns BP1 and BP2 and may include a pattern portion disposed on the light-emitting elements ED. The pattern portion may be disposed to partially surround the outer surface of the light-emitting diodes ED, and may not cover both sides or both ends of the light-emitting diodes ED. The pattern portion may form a linear or island pattern in each sub-pixel SPXn in a plan view. The pattern portion of the second insulating layer PAS2 can protect the light-emitting elements ED and can fix the light-emitting elements ED during the process of fabricating the display device 10. The second insulating layer PAS2 may be disposed to fill the space between light-emitting diodes ED and the first passivation layer PAS1 thereunder. A portion of the second insulating layer PAS2 may be disposed on the bank layer BNL and in the subsidiary area SA.

The second insulating layer PAS2 may include contacts CT1 and CT2 disposed in the subsidiary area SA. The second insulating layer PAS2 may include a first contact CT1 overlapping the first electrode RME1 and a second contact CT2 overlapping the second electrode RME2. The contacts CT1 and CT2 may penetrate through the second insulating layer PAS2 in addition to the first insulating layer PAS. Each of the first contacts CT1 and the second contacts CT2 may expose a portion of the upper surface of the first electrode RME1 or the second electrode RME2 thereunder.

The connection electrodes CNE; CNE1 and CNE2 may be disposed on the electrodes RME and the bank patterns BP1 and BP2. The first connection electrode CNE1 may be disposed on the first electrode RME1 and the first bank pattern BP1. The first connection electrode CNE1 may partially overlap the first electrode RME1 and may be disposed from the emission area EMA to the subsidiary area SA beyond the bank layer BNL. The second connection electrode CNE2 may be disposed on the second electrode RME2 and the second bank pattern BP2. The second connection electrode CNE2 may partially overlap the second electrode RME2 and may be disposed from the emission area EMA to the subsidiary area SA beyond the bank layer BNL.

Each of the first connection electrode CNE1 and the second connection electrode CNE2 may be disposed on the second insulating layer PAS2 and may be in contact with the light-emitting elements ED. The first connection electrode CNE1 may partially overlap the first electrode RME1 and may be in contact with first ends of the light-emitting elements ED. The second connection electrode CNE2 may partially overlap the second electrode RME2 and may be in contact with second ends of the light-emitting elements ED. The connection electrodes CNE may be disposed across the emission area EMA and the subsidiary area SA. A portion of each of the connection electrodes CNE that may be disposed in the emission area EMA may be in contact with the light-emitting elements ED, and a part thereof that may be disposed in the subsidiary area SA may be electrically connected to the third conductive layer. The first connection electrode CNE1 may be in contact with the first ends of the light-emitting elements ED, and the second connection electrode CNE2 may be in contact with the second ends of the light-emitting elements ED.

In the display device according to an embodiment, each of the connection electrodes CNE may be in contact with the electrodes RME through the contacts CT1 and CT2 located in the subsidiary area SA. The first connection electrode CNE1 may be in contact with the first electrode RME1 through the first contact CT1 penetrating the first insulating layer PAS1, the second insulating layer PAS2 and the third insulating layer PAS3 in the subsidiary area SA. The second connection electrode CNE2 may be in contact with the second electrode RME2 through the second contact CT2 penetrating the first insulating layer PAS1 and the second insulating layer PAS2 in the subsidiary area SA. The connection electrodes CNE may be electrically connected to the third conductive layer through the respective electrodes RME. The first connection electrode CNE1 may be electrically connected to the first transistor T1 to apply the first supply voltage, and the second connection electrode CNE2 may be electrically connected to the second voltage line VL2 to apply the second supply voltage. Each of the connection electrodes CNE may be in contact with the light-emitting elements ED in the emission area EMA to transmit the supply voltage to the light-emitting elements ED.

It is, however, to be understood that the disclosure is not limited thereto. In some embodiments, the connection electrodes CNE may be in direct contact with the third conductive layer, or may be electrically connected to the third conductive layer through other patterns than the electrodes RME.

The connection electrodes CNE may include a conductive material. For example, the connection electrodes CNE may include ITO, IZO, ITZO, aluminum (Al), etc. For example, the connection electrodes CNE may include a transparent conductive material, and lights emitted from the light-emitting elements ED may transmit the connection electrodes CNE to exit.

The third insulating layer PAS3 may be disposed on the second connection electrode layer CNE2 and the second insulating layer PAS2. The third insulating layer PAS3 may be disposed entirely on the second insulating layer PAS2 to cover the second connection electrode CNE2, and the first connection electrode layer CNE1 may be disposed on the third insulating layer PAS3. The third insulating layer PAS3 may insulate the first connection electrode CNE1 and the second connection electrode CNE2 from each other so that they are not in direct contact with each other.

The third insulating layer PAS3 may include first contacts CT1 disposed in the subsidiary area SA. The first contact CT1 may penetrate through the third insulating layer PAS3 in addition to the first insulating layer PAS1 and the second insulating layer PAS2. The first contacts CT1 may expose a portion of the upper surface of the first electrode RME1 thereunder.

Although not shown in the drawings, another insulating layer PAS4 (see FIG. 7) may be further disposed on the third insulating layer PAS3, and the first connection electrode CNE1. The insulating layer can protect the elements disposed on the substrate SUB against the external environment.

Each of the above-described first insulating layer PAS1, second insulating layer PAS2 and third insulating layer PAS3 may include an inorganic insulating material or an organic insulating material. For example, each of the first insulating layer PAS1, the second insulating layer PAS2 and the third insulating layer PAS3 may include an inorganic insulating material, or the first insulating layer PAS1 and the third insulating layer PAS3 may include an inorganic insulating material while the second insulating layer PAS2 may include an organic insulating material. Each of the first insulating layer PAS1, the second insulating layer PAS2 and the third insulating layer PAS3 or at least one thereof may be formed in a structure in which insulating layers are alternately or repeatedly stacked on one another. According to an embodiment of the disclosure, each of the first insulating layer PAS1, the second insulating layer PAS2 and the third insulating layer PAS3 may be made of at least one of silicon oxide (SiOx), silicon nitride (SiNx), and silicon oxynitride (SiOxNy). The first insulating layer PAS1, the second insulating layer PAS2 and the third insulating layer PAS3 may be made of the same material. In other embodiments, some of them may be made of the same material while the other(s) may be made of different material(s), or they may be made of different materials.

Figure 6:
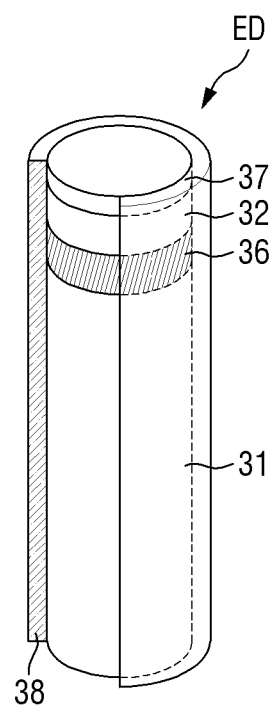
FIG. 6 is a schematic view showing a light-emitting element according to an embodiment of the disclosure.

FIG. 6 is a schematic view showing a light-emitting element according to an embodiment of the disclosure.

Referring to FIG. 6, a light-emitting element ED may be a light-emitting diode. Specifically, the light-emitting element ED may have a size from nanometers to micrometers and may be an inorganic light-emitting diode made of an inorganic material. The light-emitting diode ED may be aligned between two electrodes facing each other as polarities may be created by forming an electric field in a particular direction between the two electrodes.

The light-emitting diode ED according to an embodiment may have a shape extended in a direction. The light-emitting element ED may have a shape of a cylinder, a rod, a wire, a tube, etc. It is to be understood that the shape of the light-emitting diode ED is not limited thereto. The light-emitting diode ED may have a variety of shapes including a polygonal column shape such as a cube, a cuboid and a hexagonal column, or a shape that may be extended in a direction with partially inclined outer surfaces.

The light-emitting diode ED may include semiconductor layers doped with a dopant of a conductive type (e.g., p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the first semiconductor layer 31 may be at least one of AlGaInN, GaN, AlGaN, InGaN, AlN and InN doped with n-type dopant. The n-type dopant doped into the first semiconductor layer 31 may be Si, Ge, Sn, etc.

The second semiconductor layer 32 may be disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \leq x \leq 1$, $0 \leq y \leq 1$, $0 \leq x+y \leq 1$). For example, the second semiconductor layer 32 may be at least one of AlGaInN, GaN, AlGaN, InGaN, AlN and InN doped with p-type dopant. The p-type dopant doped into the second semiconductor layer 32 may be Mg, Zn, Ca, Ba, etc.

Although each of the first semiconductor layer 31 and the second semiconductor layer 32 is implemented as a single layer in the drawings, the disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer. For example, the light-emitting elements ED may further include another semiconductor layer disposed between the first semiconductor layer 31 and the emissive layer 36 or between the second semiconductor layer 32 and the emissive layer 36. The semiconductor layer disposed between the first semiconductor layer 31 and the emissive layer 36 may be at least one of AlGaInN, GaN, AlGaN, InGaN, AlN, InN and SLs doped with an n-type dopant. The semiconductor layer disposed between the second semiconductor layer 32 and the emissive layer 36 may be at least one of AlGaInN, GaN, AlGaN, InGaN, AlN, and InN doped with a p-type dopant.

The emissive layer 36 may be disposed between the first semiconductor layer 31 and the second semiconductor layer 32. The emissive layer 36 may include a material having a single or multiple quantum well structure. In case that the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. The emissive layer 36 may include a material such as AlGaN, AlGaInN, and/or InGaN. In particular, in case that the emissive layer 36 has a multi-quantum well structure in which quantum layers and well layers are alternately stacked on one another, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy may be alternately stacked on one another, and may include other Group III to Group V semiconductor materials depending on the wavelength range of the emitted light. Accordingly, the light emitted from the emissive layer 36 may not be limited to the light of the blue wavelength band. The emissive layer 36 may emit light of red or green wavelength bands in some implementations.

The electrode layer 37 may be an ohmic connection electrode. It is, however, to be understood that the disclosure is not limited thereto. The electrode layer 37 may be a Schottky connection electrode. The light-emitting diode ED may include at least one electrode layer 37. It is, however, to be understood that the disclosure is not limited thereto. The electrode layer 37 may be eliminated.

The electrode layer 37 can reduce the resistance between the light-emitting element ED and the electrodes or the connection electrodes in case that the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO and ITZO.

The insulating film 38 may be disposed to surround the outer surfaces of the semiconductor layers and electrode layers described above. For example, the insulating film 38 may be disposed to surround at least the outer surface of the emissive layer 36, with both ends of the light-emitting element ED in the longitudinal direction exposed. A portion of the upper surface of the insulating film 38 may be rounded in cross section, which may be adjacent to at least one of the ends of the light-emitting element ED.

The insulating film 38 may include materials having insulating properties, for example, at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx). Although the insulating film 38 is formed as a single layer in the drawings, the disclosure is not limited thereto. In some embodiments, the insulating film 38 may be made up of a multilayer structure in which multiple layers are stacked on one another.

The insulating film 38 can protect the semiconductor layers and the electrode layer of the light-emitting elements ED. The insulating film 30 can prevent an electrical short-circuit that may occur in the emissive layer 36 if it comes in direct contact with an electrode through which an electric signal may be transmitted to the light-emitting diode ED. The insulating film 38 can prevent a decrease in luminous efficiency.

The outer surface of the insulating film 38 may be subjected to surface treatment. The light-emitting elements ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

According to an embodiment of the disclosure, the display device 10 may further include a color control layer CCR (see FIG. 7) and a color filter layer CFL (see FIG. 7) disposed above the light-emitting elements ED. The lights emitted from the light-emitting elements ED may exit through the color control layer CCR and the color filter layer CFL. Even if the light-emitting elements ED of the same type may be disposed in different sub-pixel SPXn, the different sub-pixels SPXn may output lights of different colors.

Figure 7:
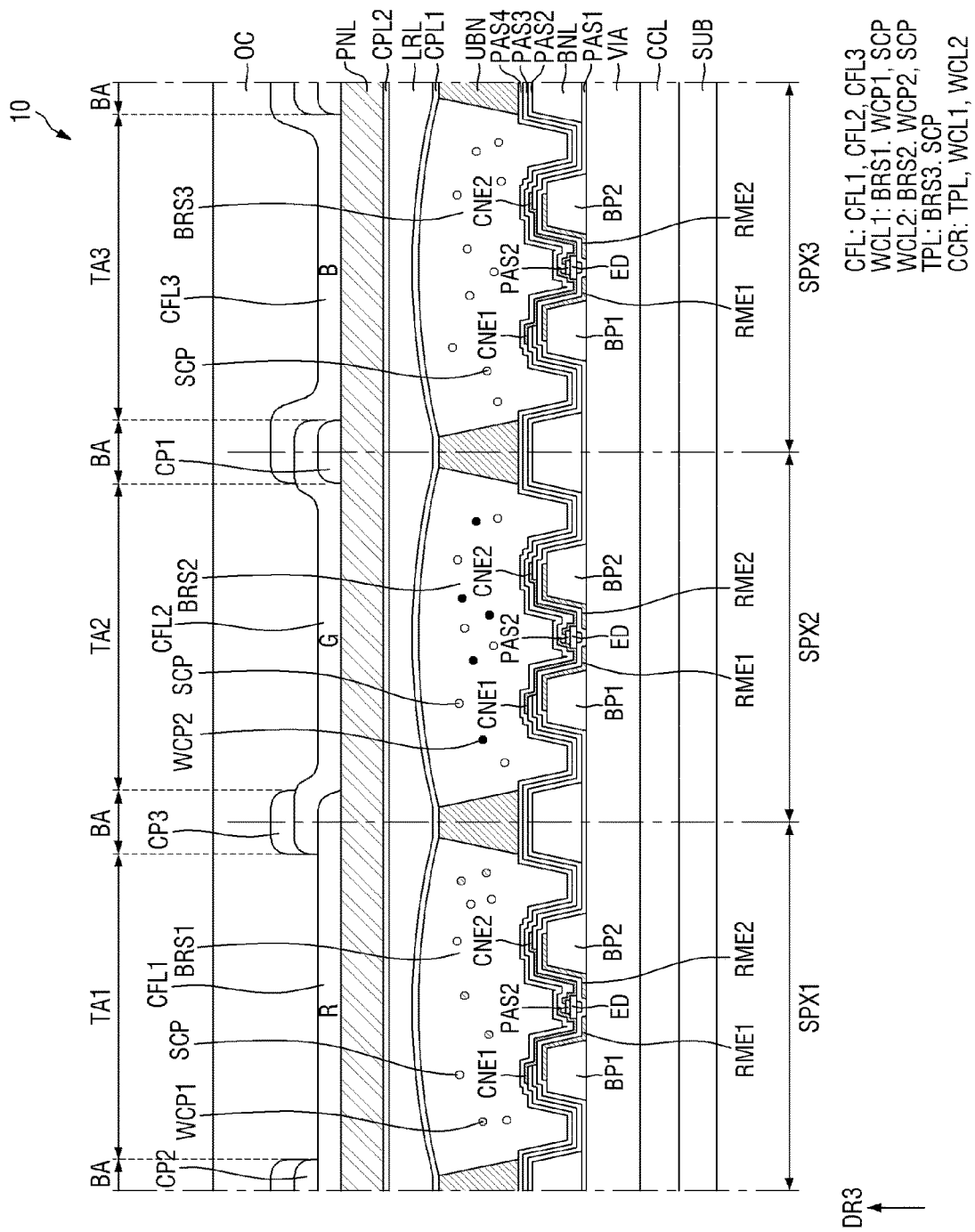
FIG. 7 is a schematic cross-sectional view of a display device according to an embodiment of the disclosure.

FIG. 7 is a schematic cross-sectional view of a display device according to an embodiment of the disclosure.

Referring to FIG. 7, the display device 10 may include light-emitting elements ED disposed on a substrate SUB, and a color control layer CCR and a color filter layer CFL disposed above them. The display device 10 may further include layers disposed between the color control layer CCR and the color filter layer CFL. Hereinafter, layers disposed over the light-emitting elements ED of the display device 10 will be described.

The fourth insulating layer PAS4 may be disposed on the third insulating layer PAS3, the connection electrodes CNE1 and CNE2, and the bank layer BNL. The fourth insulating layer PAS4 can protect the layers disposed on the substrate SUB. It is to be noted that the fourth insulating layer PAS4 may be eliminated.

An upper bank layer UBN, a color control layer CCR, color patterns CP1, CP2 and CP3, and a color filter layer CFL may be disposed on the fourth insulating layer PAS4. Multiple capping layers CPL1 and CPL2, a low-refractive layer LRL and a planarization layer PNL may be disposed between the color control layer CCR and the color filter layer CFL. An overcoat layer OC may be disposed on the color filter layer CFL.

The display device 10 may include light-transmitting areas TA1, TA2 and TA3 where the color filter layer CFL may be disposed to allow light to exit, and a light-blocking area BA between the light-transmitting areas TA1, TA2 and TA3 where no light may exit. The light-transmitting areas TA1, TA2 and TA3 may be located in line with certain portions of the emission area EMA of each of the sub-pixels SPXn, and the light-blocking area BA may be another area (or areas) other than the light-transmitting areas TA1, TA2 and TA3.

The upper bank layer UBN may be disposed on the fourth insulating layer PAS4 to overlap the bank layer BNL. The upper bank layer UBN may be disposed in a lattice pattern, including portions extended in the first direction DR1 and the second direction DR2 in a plan view. The upper bank layer UBN may surround the emission area EMA or a portion where the light-emitting elements ED may be disposed. The upper bank layer UBN may define a space in which the color control layer CCR may be disposed.

The color control layer CCR may be disposed on the fourth insulating layer PAS4 in the space surrounded by the upper bank layer UBN. The color control layer CCR may be disposed in the light-transmitting areas TA1, TA2 and TA3 surrounded by the upper bank layer UBN to form an island-like pattern in the display area DPA. It should be understood, however, that the disclosure is not limited thereto. The color control layer CCR may be extended in a direction and disposed across the sub-pixels SPXn to form a linear pattern.

In an embodiment where the light-emitting elements ED of each of the sub-pixels SPXn emit blue light of the third color, the color control layer CCR may include a first wavelength conversion layer WCL1 disposed in the first sub-pixel SPX1 in line with the first light-transmitting area TA1, a second wavelength conversion layer WCL2 disposed in the second sub-pixel SPX2 in line with the second light-transmitting area TA2, and a transparent layer TPL disposed in the third sub-pixel SPX3 in line with the third light-transmitting area TA3.

The first wavelength conversion layer WCL1 may include a first base resin BRS1 and first wavelength-converting particles WCP1 dispersed in the first base resin BRS1. The second wavelength conversion layer WCL2 may include a second base resin BRS2 and second wavelength-converting particles WCP2 dispersed in the second base resin BRS2. The first wavelength conversion layer WCL1 and the second wavelength conversion layer WCL2 convert and transmit the wavelength of the blue light of the third color incident from the light-emitting diodes ED. The first wavelength conversion layer WCL1 and the second wavelength conversion layer WCL2 may further include scattering particles SCP included in each base resin, and the scattering particles SCP can increase wavelength conversion efficiency.

The transparent layer TPL may include a base resin BRS3 and scattering particles SCP dispersed in the third base resin BSR3. The transparent layer TPL transmits the wavelength of the blue light B of the third color incident from the light-emitting diodes ED as the wavelength may be. The scattering particles SCP of the transparent layer TPL may adjust an emission path of exiting light through the transparent layer TPL. The transparent layer TPL may include no wavelength conversion material.

The scattering particles SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc., or a combination thereof Examples of the material of the organic particles may include an acrylic resin, a urethane resin, etc., or a combination thereof.

The first to third base resins BRS1, BRS2 and BRS3 may include a transparent organic material. For example, the first to third base resins BRS1, BRS2 and BRS3 may include an epoxy resin, an acrylic resin, a cardo resin, an imide resin, or the like, or a combination thereof. The first to third base resins BRS1, BRS2 and BRS3 may be made of, but are not limited to, the same material.

The first wavelength-converting particles WCP1 may convert the blue light of the third color into the red light R of the first color, and the second wavelength-converting particles WCP2 may convert the blue light of the third color into the green light G of the second color. The first wavelength-converting particles WCP1 and the second wavelength-converting particles WCP2 may be quantum dots, quantum rods, phosphors, etc. The quantum dots may include IV nanocrystals, II-VI compound nanocrystals, III-V compound nanocrystals, IV-VI nanocrystals, or combinations thereof.

In some embodiments, the color control layer CCR may be formed via an inkjet printing process or a photoresist process. The color control layer CCR may be formed via drying or exposure and development processes after a material forming it may be sprayed or applied in the space surrounded by the upper bank layer UBN. For example, in an embodiment in which the color control layer CCR may be formed via an inkjet printing process, the upper surface of each layer of the color control layer CCR may be formed to be curved, so that the edge thereof that may be adjacent to the upper bank layer UBN may be higher than the center thereof in the drawings. It is, however, to be understood that the disclosure is not limited thereto. In an embodiment in which the color control layer CCR may be formed via a photoresist process, the upper surface of each layer of the color control layer CCR may be formed to be flat, so that the edge thereof that may be adjacent to the upper bank layer UBN may be parallel to the upper surface of the upper bank layer UBN, or the center of the color control layer CCR may be higher than it, unlike the example shown in the drawings.

While the light-emitting elements ED of different sub-pixels SPXn may emit light of the same color, e.g., the blue light of the third color, the lights of different colors may exit from the different sub-pixels SPXn. For example, the light emitted from the light-emitting diodes ED disposed in the first sub-pixel SPX1 may be incident on the first wavelength conversion layer WCL1, the light emitted from the light-emitting diodes ED disposed in the second sub-pixel SPX2 may be incident on the second wavelength conversion layer WCL2, and the light emitted from the light-emitting diodes ED disposed in the third sub-pixel SPX3 may be incident on the transparent layer TPL.

The light incident on the first wavelength conversion layer WCL1 may be converted into red light, the light incident on the second wavelength conversion layer WCL2 may be converted into green light, and the light incident on the transparent layer TPL may be transmitted as the same blue light without wavelength conversion. Although the sub-pixels SPXn include the light-emitting elements ED that emit light of the same color, lights of different colors can be output by disposing the color control layer CCR over the sub-pixels.

The first capping layer CPL1 may be disposed on the color control layer CCR and the upper bank layer UBN. The first capping layer CPL1 can prevent impurities such as moisture and air from permeating from the outside to damage or contaminate the color control layer CCR. The first capping layer CPL1 may include an inorganic insulating material.

The low-refractive layer LRL may be disposed on the first capping layer CPL1. The low-refractive layer LRL may be an optical layer that recycles lights which have passed through the color control layer CCR, and can improve the emission efficiency and the color purity of the display device 10. The low-refractive layer LRL may be made of an organic material having a low refractive index, and may provide a flat surface over the color control layer CCR and the upper bank layer UBN having different heights.

The second capping layer CPL2 may be disposed on the low-refractive layer LRL, and can prevent impurities such as moisture and air from penetrating from the outside to damage or contaminate the low-refractive layer LRL. The second capping layer CPL2 may include an inorganic insulating material similar to the first capping layer CPL1.

The planarization layer PNL may be disposed across the entire display area DPA and the entire non-display area NDA on the second capping layer CPL2. The planarization layer PNL may overlap the color control layer CCR in the display area DPA, and may overlap a dam to be described later in the non-display area NDA.

The planarization layer PNL can protect the elements disposed on the substrate SUB, in addition to the capping layers CPL1 and CPL2 and the low-refractive layer LRL, and can partially provide a flat surface over them having different heights. In particular, the planarization layer PNL may provide a flat surface over the color control layer CCR, the upper bank layer UBN and the bank layer BNL thereunder which have different heights in the display area DPA, so that the color filter layer CFL can be formed on the flat surface.

The color filter layer CFL may be disposed on the planarization layer PNL. The color filter layer CFL may be disposed in the light-transmitting areas TA1, TA2 and TA3, and may be partially disposed in the light-blocking area BA. A portion of the color filter layer CFL may overlap another part or the color patterns CP1, CP2 and CP3 in the light-blocking area BA. Lights may exit in the light-transmitting areas TA1, TA2 and TA3 where the color filter layer CFL does not overlap another. Light may be blocked in the light-blocking area BA where the color filter layer CFL overlaps another or the color patterns CP1, CP2 and CP3 are disposed.

The color filter layer CFL may include a first color filter CFL1 disposed in the first sub-pixel SPX1, a second color filter CFL2 disposed in the second sub-pixel SPX2, and a third color filter CFL3 disposed in the third sub-pixel SPX3. Each of the color filters CFL1, CFL2 and CFL3 may be formed in a linear pattern disposed in the light-transmitting areas TA1, TA2 and TA3 or the emission areas EMA. It is, however, to be understood that the disclosure is not limited thereto. The color filters CFL1 CFL2 and CFL3 may be disposed in line with the light-transmitting areas TA1, TA2, and TA3, respectively, to form an island-like pattern.

The color filter layer CFL may include a colorant such as a dye and a pigment that absorbs lights in other wavelength ranges than a particular wavelength range. The color filters CFL1, CFL2 and CFL3 may be disposed in the sub-pixels SPXn, respectively, to transmit only some of the lights incident on the color filters CFL1, CFL2 and CFL3 in the respective sub-pixels SPXn. The sub-pixels SPXn of the display device 10 may selectively display only the lights transmitted through the color filters CFL1, CFL2 and CFL3. According to an embodiment of the disclosure, the first color filter CFL1 may be a red color filter layer, the second color filter CFL2 may be a green color filter layer, and the third color filter CFL3 may be a blue color filter layer. The lights emitted from the light-emitting elements ED may exit through the color control layer CCR and the color filter layer CFL.

The color patterns CP1, CP2 and CP3 may be disposed on the planarization layer PNL or the color filter layer CFL. The color patterns CP1, CP2 and CP3 may include the same material as the color filter layer CFL and may be disposed in the blocking area BA. In the light-blocking area BA, the color patterns CP1, CP2 and CP3 and the different color filters CFL1, CFL2 and CFL3 may be disposed such that they are stacked on one another, and transmission of light can be blocked in the region where they are stacked on one another.

The first color pattern CP1 may include the same material as that of the first color filter CFL1 and may be disposed in the light-blocking area BA. The first color pattern CP1 may be disposed directly on the planarization layer PNL in the light-blocking area BA but may not be disposed in the light-blocking area BA adjacent to the first light-transmitting area TA1 of the first sub-pixel SPX1. The first color pattern CP1 may be disposed in the light-blocking area BA between the second sub-pixel SPX2 and the third sub-pixel SPX3. The first color filter CFL1 may be disposed in the light-blocking area BA around the first sub-pixel SPX1.

The second color pattern CP2 may include the same material as that of the second color filter CFL2 and may be disposed in the light-blocking area BA. The second color pattern CP2 may be disposed directly on the planarization layer PNL in the light-blocking area BA but may not be disposed in the light-blocking area BA adjacent to the second light-transmitting area TA2 of the second sub-pixel SPX2. The second color pattern CP2 may be disposed in the light-blocking area BA between the first sub-pixel SPX1 and the third sub-pixel SPX3, or at the boundary between the outermost sub-pixel SPXn of the display area DPA and the non-display area NDA. The second color filter CFL2 may be disposed in the light-blocking area BA around the second sub-pixel SPX2.

Similarly, the third color pattern CP3 may include the same material as that of the third color filter CFL3 and may be disposed in the light-blocking area BA. The third color pattern CP3 may be disposed directly on the planarization layer PNL in the light-blocking area BA but may not be disposed in the light-blocking area BA adjacent to the third light-transmitting area TA3 of the third sub-pixel SPX3. The third color pattern CP3 may be disposed in the light-blocking area BA between the first sub-pixel SPX1 and the second sub-pixel SPX2. The third color filter CFL3 may be disposed in the light-blocking area BA around the third sub-pixel SPX3.

In the display device 10, the region where the bank layer BNL and the upper bank layer UBN overlap each other may be the light-blocking area BA. In the light-blocking area BA, each of the first color pattern CP1, the second color pattern CP2 and the third color pattern CP3 may be disposed to overlap at least one of the color filters CFL1, CFL2, and CFL3 including different color materials. For example, the first color pattern CP1 may be disposed to overlap the second color filter CFL2 and the third color filter CFL3, the second color pattern CP2 may be disposed to overlap the first color filter CFL1 and the third color filter CFL3, and the third color pattern CP3 may be disposed to overlap the first color filter CFL1 and the second color filter CFL2. In each of the light-blocking areas BA, the color patterns CP1, CP2 and CP3 having different colorants and the different color filters CFL1, CFL2 and CFL3 overlap each other, so that transmission of light can be blocked.

The color patterns CP1, CP2 and CP3 may be stacked on the color filters CFL1, CFL2 and CFL3, and color mixing between adjacent areas can be prevented by the materials including different colorants. Since the color patterns CP1, CP2 and CP3 include the same material as the color filters CFL1, CFL2 and CFL3, external light or reflected light passing through the light-blocking area BA may have a wavelength band of a certain color. The eye color sensibility that a user's eyes perceive varies depending on the color of the light. In particular, the light in the blue wavelength band may be perceived less sensitively to a user than the light in the green wavelength band and the light in the red wavelength band. In the display device 10, the color patterns CP1, CP2 and CP3 can be disposed in the light-blocking area BA, and thus the transmission of light can be blocked and the user can perceive the reflected light less sensitively, so that it may be possible to reduce reflected light by external light by absorbing a portion of the light introduced from the outside of the display device 10.

The overcoat layer OC may be disposed on the color filter layer CFL and the color patterns CP1, CP2 and CP3. The overcoat layer OC may be disposed throughout the entire display area DPA, and may be partially disposed in the non-display area NDA. The overcoat layer OC may include an organic insulating material to protect the elements disposed in the display area DPA from the outside.

A display device 10 according to an embodiment of the disclosure may include the color control layer CCR and the color filter layer CFL disposed over the light-emitting elements ED, so that it can display lights of different colors even if the same type of light-emitting elements ED are disposed in different sub-pixels SPXn.

For example, the light-emitting elements ED disposed in the first sub-pixel SPX1 may emit the blue light of the third color, and the light may be incident on the first wavelength conversion layer WCL1 through the fourth insulating layer PAS4. The first base resin BRS1 of the first wavelength conversion layer WCL1 may be made of a transparent material, and some of the lights may pass through the first base resin BRS1 and may be incident on the first capping layer CPL1 disposed thereon. At least some of the lights may be incident on the scattering particles SCP and the first wavelength-converting particles WCP1 dispersed in the first base resin BRS1. The light may be scattered and the wavelength may be converted into the wavelength of red light, such that the red light may be incident on the first capping layer CPL1. Lights incident on the first capping layer CPL1 may pass through the low-refractive layer LRL, the second capping layer CPL2 and the planarization layer PNL and may be incident on the first color filter CFL1. The first color filter CFL1 can block the transmission of other lights except red light. Accordingly, red light may be emitted from the first sub-pixel SPX1.

Similarly, lights emitted from the light-emitting elements ED disposed in the second sub-pixel SPX2 may pass through the fourth insulating layer PAS4, the second wavelength conversion layer WCL2, the first capping layer CPL1, the low-refractive layer LRL, the second capping layer CPL2, the planarization layer PNL and the second color filter CFL2, to exit as green lights.

The light-emitting elements ED disposed in the third sub-pixel SPX3 may emit blue light of the third color, and the light may be incident on the light-transmitting layer through the fourth insulating layer PAS4. The third base resin BRS3 of the transparent layer TPL may be made of a transparent material, and some of the lights may pass through the third base resin BRS3 and may be incident on the first capping layer CPL1 disposed thereon. Lights incident on the first capping layer CPL1 may pass through the low-refractive layer LRL, the second capping layer CPL2 and the planarization layer PNL and may be incident on the third color filter CFL3. The third color filter CFL3 can block the transmission of other lights except blue light. Accordingly, blue light may be emitted from the third sub-pixel SPX3.

Figure 8:
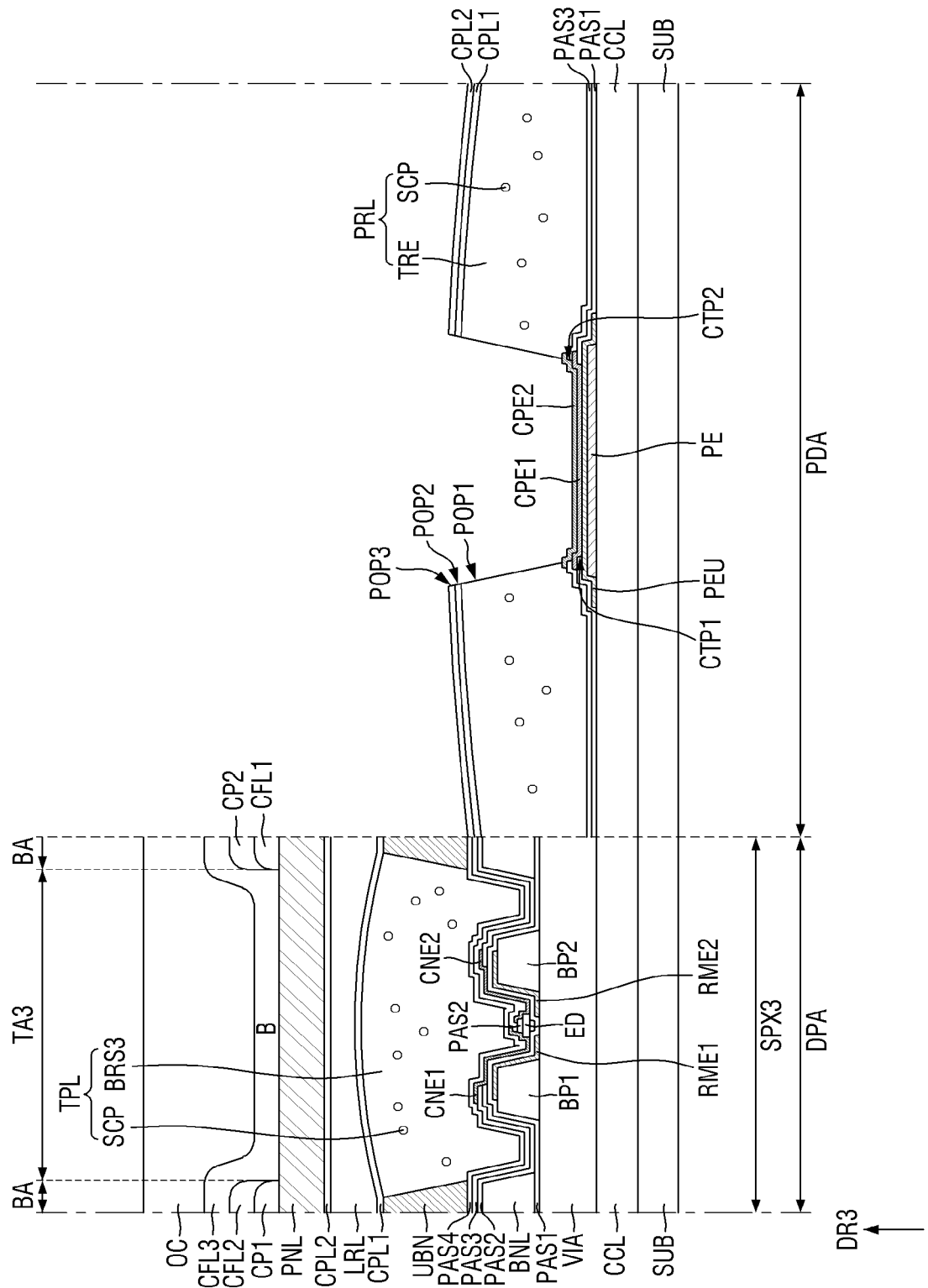
FIG. 8 is a schematic cross-sectional view showing a sub-pixel and a portion of a pad area of a display device according to an embodiment.

FIG. 8 is a schematic cross-sectional view showing a sub-pixel and a portion of a pad area of a display device according to an embodiment. FIG. 8 shows a cross-sectional structure of a sub-pixel together in order to illustrate the structure of the pad area, and the pad area includes a single pad electrode, for example.

Referring to FIG. 8, the substrate SUB may include a display area DPA and a pad area PDA. The pad area PDA may be disposed at an edge on the outer side of the display area DPA of the substrate SUB. A pad electrode PE may be disposed on the pad area PDA of the substrate SUB. The pad electrode PE may be formed of the third conductive layer of FIGS. 4 and 5 described above. For example, the pad electrode PE may be disposed on the first interlayer dielectric layer IL1 (see FIG. 4), and the source electrodes S1 and S2 (see FIG. 4) and the drain electrodes D1 and D2 (see FIG. 4) and may be disposed on the same layer.

The pad electrode PE may be disposed in the pad area PDA and may be connected to one of the above-described wire pads WPD (see FIG. 2). The pad electrode PE may be electrically connected to one of the lines disposed in the display area DPA, and an electrical signal applied from the wire pad WPD may be transmitted to the lines in the display area DPA via the pad electrode PE.

The via layer VIA in the display area DPA may not be disposed in the pad area PDA, and the pad electrode PE disposed on the first interlayer dielectric layer IL1 (see FIG. 4) may not be covered by the via layer VIA.

A pad electrode upper layer PEU may be disposed on the pad electrode PE. The pad electrode upper layer PEU may be disposed to cover the pad electrode PE. For example, the pad electrode upper layer PEU may be formed to have a width greater than that of the pad electrode PE, and thus may be disposed to cover the pad electrode PE. The pad electrode upper layer PEU may include a material containing aluminum (Al) or an alloy material containing aluminum (Al), nickel (Ni), lanthanum (La), etc., or a combination thereof. For example, the pad electrode upper layer PEU may be made of s-Al. The pad electrode upper layer PEU may include the same material as the electrode RME (see FIG. 4) in the display area DPA. According to an embodiment of the disclosure, the pad electrode PE may include the same material as the third conductive layer of the display area DPA, and the pad electrode upper layer PEU may include the same material as the electrode RME of the display area DPA.

The first insulating layer PAS1 may be disposed on the pad electrode upper layer PEU. The first insulating layer PAS1 may be disposed on the entire surface of the display area DPA and the pad area PDA, and may be extended from the display area DPA to the pad area PDA. The first insulating layer PAS1 can protect the pad electrode PE and the pad electrode upper layer PEU and may insulate other electrodes from each other.

The first insulating layer PAS1 may be disposed to cover the pad electrode upper layer PEU and may include an opening exposing a portion of the upper surface thereof. For example, the first insulating layer PAS1 may include a first pad contact portion CTP1 exposing a portion of the upper surface of the pad electrode upper layer PEU. The first pad contact portion CTP1 may be disposed on the pad electrode upper layer PEU in the pad area PDA and may be disposed to overlap the pad electrode upper layer PEU. More than one first pad contact portions CTP1 may be disposed along the longitudinal direction of the pad electrode upper layer PEU. At the first pad contact portion CTP1, the pad electrode upper layer PEU and a pad electrode capping layer to be described later may be in contact with each other.

The second insulating layer PAS2 of the display area DPA may not be disposed in the pad area PDA. In the pad area PDA, only the first insulating layer PAS1 and the third insulating layer PAS3 to be described later may be disposed, so that the height difference between the pad electrode PE and the pad electrode capping layer can be reduced.

Multiple pad electrode capping layers CPE1 and CPE2 may be disposed on the pad electrode upper layer PEU in the pad area PDA. According to an embodiment, the display device 10 may include a first pad electrode capping layer CPE1 disposed on the pad electrode upper layer PEU, and a second pad electrode capping layer CPE2 disposed on the first pad electrode capping layer CPE1. The third insulating layer PAS3 may be partially disposed between the first pad electrode capping layer CPE1 and the second pad electrode capping layer CPE2.

The first pad electrode capping layer CPE1 may be disposed on the first insulating layer PAS1 disposed in the pad area PDA, and may be in direct contact with the pad electrode upper layer PEU exposed through the first pad contact portion CTP1. The first pad electrode capping layer CPE1 may be formed in the same process as the second connection electrode CNE2 and may include the same material as the second connection electrode CNE2.

The third insulating layer PAS3 may be disposed on the first pad electrode capping layer CPE1. The third insulating layer PAS3 may be disposed entirely on the display area DPA and the pad area PDA, and may be extended from the display area DPA to the pad area PDA. The third insulating layer PAS3 may be disposed to cover the first pad electrode capping layer CPE1 and may include an opening exposing a portion of the upper surface thereof. For example, the third insulating layer PAS3 may include a second pad contact portion CTP2 exposing a portion of the upper surface of the first pad electrode capping layer CPE1. The second pad contact portion CTP2 may be disposed on the first pad electrode capping layer CPE1 in the pad area PDA and may be disposed to overlap the first pad contact portion CTP1.

The second pad electrode capping layer CPE2 may be disposed on the third insulating layer PAS3 and the first pad electrode capping layer CPE1. The second pad electrode capping layer CPE2 may be in contact with the upper surface of the first pad electrode capping layer CPE1 through the second pad contact portion CTP2 of the third insulating layer PAS3. The second pad electrode capping layer CPE2 may be formed in the same process as the first connection electrode CNE1 and may include the same material as the first connection electrode CNE1.

The pad electrode capping layers CPE1 and CPE2 may include a conductive material like the connection electrodes CNE so that they can be electrically connected to the pad electrode PE. The pad electrode capping layers CPE1 and CPE2 can prevent the pad electrode PE from being damaged during a subsequent process.

A protective layer PRL may be disposed on the pad area PDA. The protective layer PRL may be disposed on the second pad electrode capping layer CPE2 and the third insulating layer PAS3. The protective layer PRL can prevent the pad area PDA from being exposed and damaged by an etchant or a developer during the processes. Specifically, after the second pad electrode capping layer CPE2 may be formed, the process of forming the transparent layer TPL, the first wavelength conversion layer WCL1, and the second wavelength conversion layer WCL2 in the display area DPA may be performed. The pad electrode PE, the pad electrode upper layer PEU and the first pad electrode capping layer CPE1 as well as the second pad electrode capping layer CPE2 may be exposed by the developer during the above-described process. In particular, problems such as galvanic corrosion may arise in the pad electrode upper layer PEU and the first pad electrode capping layer CPE1 by a developer such as TMAH. According to this embodiment, the protective layer PRL may be formed on the second pad electrode capping layer CPE2 to cover the pad area PDA and can protect the pad area PDA during subsequent processes.

The protective layer PRL may include a polymer resin TRE. The polymer resin TRE may include a light-transmitting organic material. For example, the polymer resin TRE may include an epoxy-based resin, an acrylic resin, a cardo-based resin, an imide-based resin, or a combination thereof. The protective layer PRL may further include scattering particles SCP dispersed in the polymer resin TRE. The scattering particles SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc., or a combination thereof. Examples of the material of the organic particles may include an acrylic resin, a urethane resin, etc., or a combination thereof.

According to an embodiment of the disclosure, the protective layer PRL may be formed via the same process as the transparent layer TPL of the display area DPA, and may include the same material. For example, the polymer resin TRE of the protective layer PRL may be identical to the third base resin BRS3 of the transparent layer TPL, and the scattering particles SCP of the protective layer PRL may be identical to the scattering particles SCP of the transparent layer TPL. According to this embodiment, by forming the protective layer PRL in the pad area PDA simultaneously with the process of forming the transparent layer TPL in the display area DPA, it may be possible to protect the pad area PDA without any additional process.

The protective layer PRL may include a first pad opening POP1 exposing a portion of the upper surface of the second pad electrode capping layer CPE2. The first pad opening POP1 may overlap the pad contact portions CTP1 and CTP2 and may expose a portion of the upper surface of the second pad electrode capping layer CPE2.

An external device, for example, a printed circuit board may be attached to the pad area PDA, so that an external signal may be applied thereto. Such an external device may be attached to the pad area PDA by an anisotropic conductive film including conductive balls. The conductive balls may need to be arranged in line with the pad electrode PE so that they can be electrically connected to the pad electrode PE in the pad area PDA. According to this embodiment, the protective layer PRL may be made of an organic material such as a polymer resin to have a large thickness. Since the first pad opening POP1 formed in the protective layer PRL has a large height difference, there may be an advantage in that the conductive balls may be readily disposed in the first pad opening POP1.

Capping layers, for example, a first capping layer CPL1 and a second capping layer CPL2 disposed on the first capping layer CPL1 may be disposed on the protective layer PRL. The first capping layer CPL1 and the second capping layer CPL2 may be disposed on the entire surface of the display area DPA and the pad area PDA, and can protect the pad area PDA during subsequent processes. The first capping layer CPL1 may include a second pad opening POP2 exposing a portion of the upper surface of the second pad electrode capping layer CPE2, and the second capping layer CPL2 may include a third pad opening POP3 exposing a portion of the upper surface of the second pad electrode capping layer CPE2. The second pad opening POP2 may overlap the first pad opening POP1, and the third pad opening POP3 may overlap the second pad opening POP2. According to an embodiment of the disclosure, where the first pad opening POP1, the second pad opening POP2 and the third pad opening POP3 are formed, the side surfaces of the protective layer PRL, the side surfaces of the first capping layer CPL1 and the side surfaces of the second capping layer CPL2 may be aligned with one another.

As described above, by forming the protective layer PRL and the capping layers CPL1 and CPL2 on the pad area PDA, it may be possible to prevent the electrodes in the pad area PDA from being damaged during subsequent processes.

Hereinafter, processing steps of fabricating the display device 10 will be described with reference to other drawings.

FIGS. 9 to 16 are schematic cross-sectional views showing processing steps of fabricating a display device according to an embodiment of the disclosure. FIGS. 9 to 16 show the cross sections of the structure of the layers of a sub-pixel SPXn according to the order that they are formed, and the structure of the pad area DPA, which may correspond to the cross-sectional view of FIG. 8. A process of forming each of the layers may be performed by a patterning process and inkjet printing. In the following description, the formation order will be described in each of the processes rather than the formation method.

Figure 9:
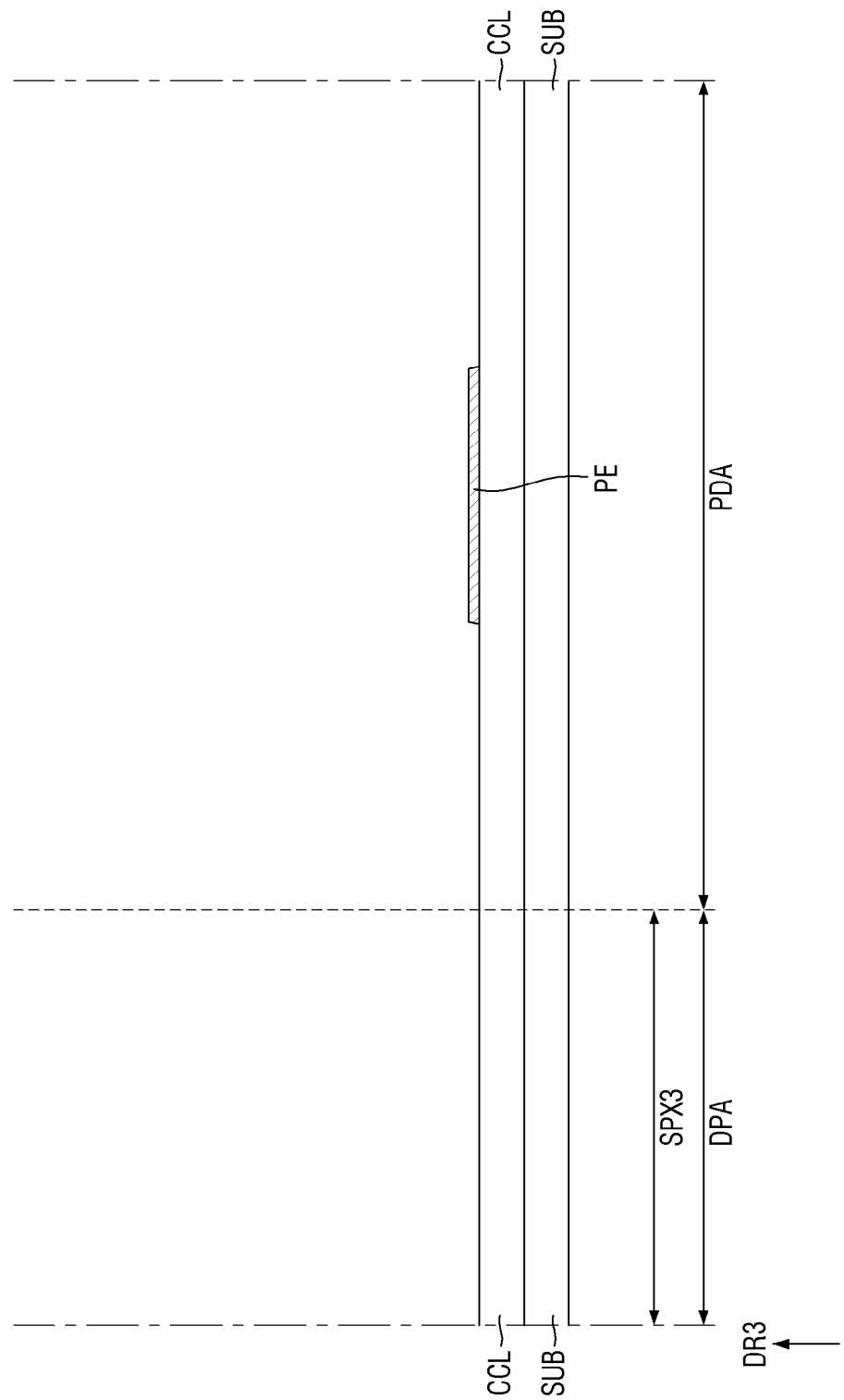
FIGS. 9 to 16 are schematic cross-sectional views showing processing steps of fabricating a display device according to an embodiment of the disclosure.

Initially, referring to FIG. 9, a substrate SUB may be prepared, and a circuit layer CCL may be formed on the substrate SUB. The circuit layer CCL forms first to third conductive layers, a buffer layer, a first gate insulating layer, and a first interlayer dielectric layer. The first to third conductive layers disposed on the substrate SUB may be formed by depositing materials forming the layers, for example, metal materials, and patterning them using a mask. The buffer layer, the first gate insulating layer, and the first interlayer dielectric layer disposed on the substrate SUB may be formed by depositing materials forming the layers, for example, insulating, materials, and patterning them using a mask if necessary. In the process of forming the third conductive layer, the pad electrode PE may be formed on the pad area PDA.

Figure 10:
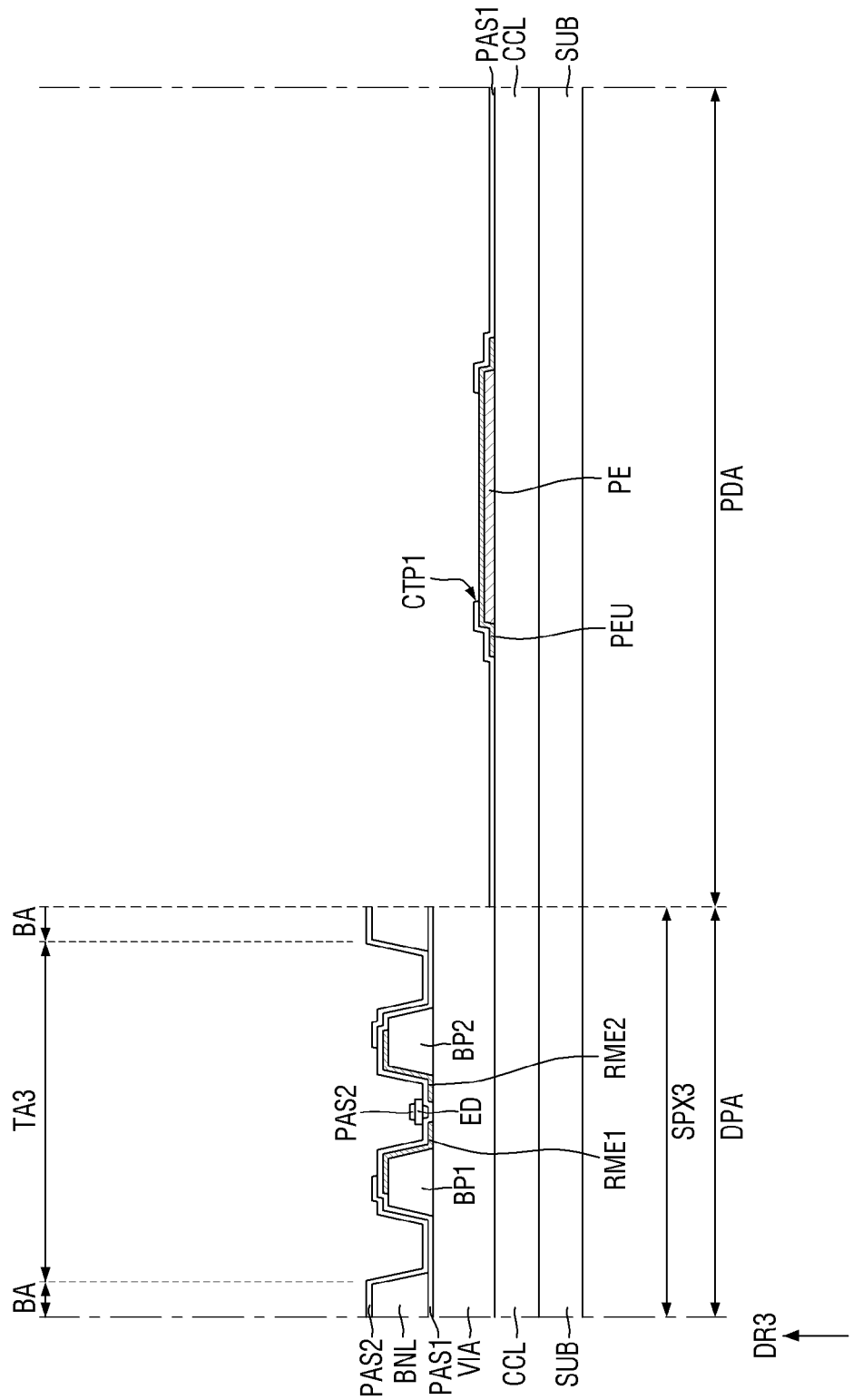

Subsequently, referring to FIG. 10, a via layer VIA may be formed on the circuit layer CCL in the display area DPA. The via layer VIA may be formed by applying an organic insulating material. Subsequently, bank patterns BP1 and BP2 may be formed on the via layer VIA. A metal material layer may be formed on the entire surface of the display area DPA and the pad area PDA and patterned, so that electrodes RME1 and RME2 and a pad electrode upper layer PEU may be formed. The electrodes RME1 and RME2 may be formed on the bank patterns BP1 and BP2 and the via layer VIA in the display area DPA, and the pad electrode upper layer PEU may be formed to cover the pad electrode PE in the pad area PDA.

Subsequently, a first insulating layer PAS1 partially covering the electrodes RME1 and RME2 and the pad electrode upper layer PEU may be formed, and a bank layer BNL may be formed on the first insulating layer PAS1. Light-emitting elements ED may be aligned and formed on the first electrode RME1 and the second electrode RME2.

The first insulating layer PAS1 may cover the electrodes RME1 and RME2 and the pad electrode upper layer PEU and may be disposed entirely on the display area DPA and the pad area PDA. The first insulating layer PAS1 may include a first pad contact portion CTP1 exposing a portion of the upper surface of the pad electrode upper layer PEU. Although not shown in the drawings, the first insulating layer PAS1 may include contact portions exposing the electrodes RME1 and RME2.

In an embodiment, the light-emitting elements ED may be disposed on the electrodes RME1 and RME2 via an inkjet printing process. After the ink in which the light-emitting elements ED are dispersed may be ejected into the area surrounded by the bank layer BNL, an electric signal may be applied to the electrodes RME1 and RME2. The light-emitting elements ED in the ink may be seated on the electrodes RME1 and RME2 while their positions and orientations may be changed.

Subsequently, a second insulating layer PAS2 may be formed on the light-emitting elements ED and the first insulating layer PAS1 in the display area DPA. The second insulating layer PAS2 may not be disposed in the pad area PDA. The second insulating layer PAS2 may cover and fix the light-emitting elements ED. The second insulating layer PAS2 may be formed by applying it entirely on the first insulating layer PAS1 in the display area DPA, and patterning it so that the ends of the light-emitting elements ED may be exposed.

Figure 11:
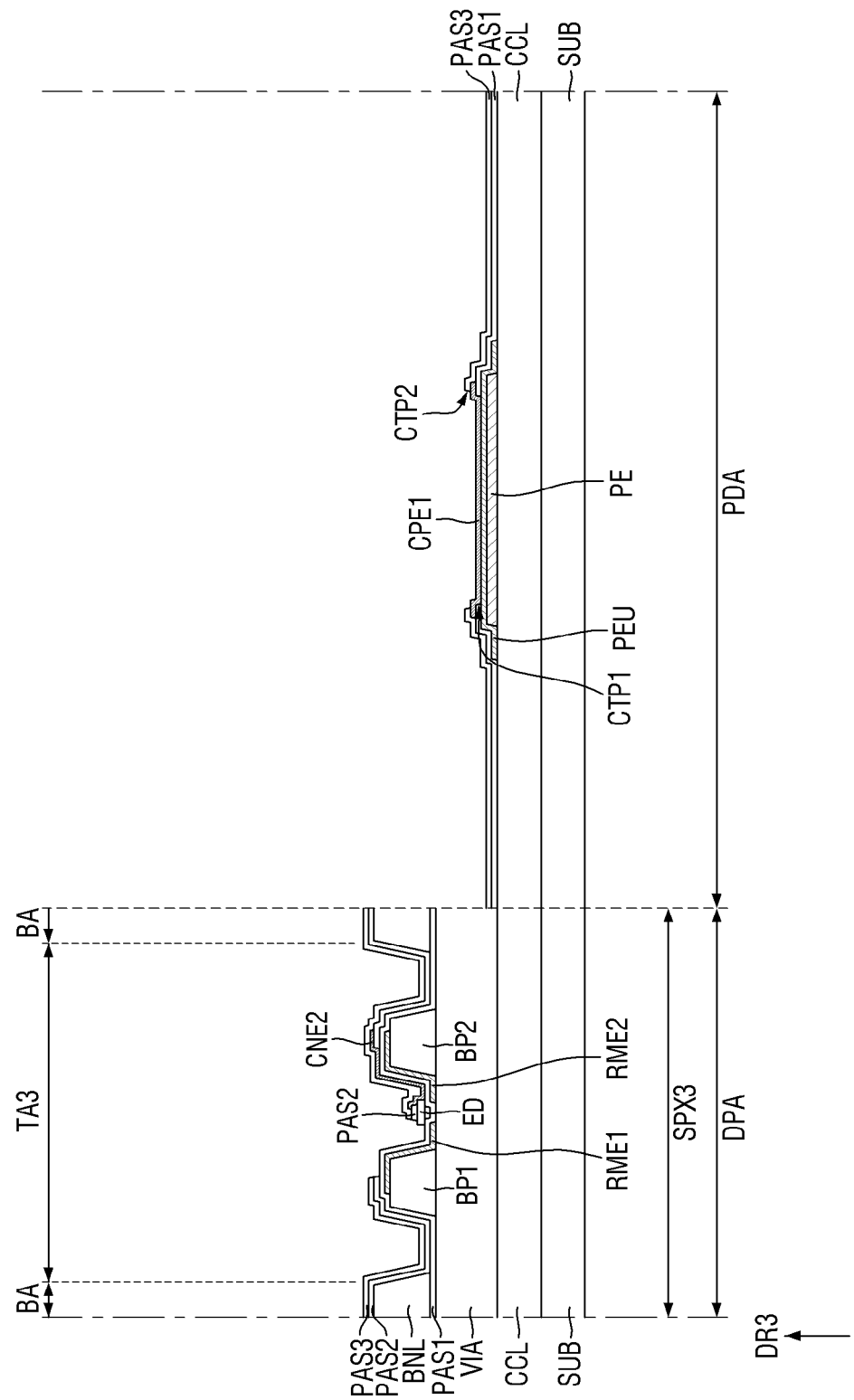

Subsequently, referring to FIG. 11, a second connection electrode CNE2 disposed in the display area DPA and a first pad electrode capping layer CPE1 disposed in the pad area PDA may be formed, and a third insulation layer PAS3 may be formed thereon. The second connection electrode CNE2 may be in contact with first ends of the light-emitting elements ED exposed by the second insulating layer PAS2, and the first pad electrode capping layer CPE1 may be in contact with the pad electrode upper layer PEU exposed by the first pad contact portion CTP1 of the first insulating layer PAS1. The third insulating layer PAS3 may be disposed on the second insulating layer PAS2 and the second connection electrode CNE2 and may be formed to expose second ends of the light-emitting elements ED together with the second insulating layer PAS2. The third insulating layer PAS3 may be disposed on the first pad electrode capping layer CPE1 in the pad area PDA, and may include a second pad contact portion CTP2 exposing a portion of the upper surface of the first pad electrode capping layer CPE1.

Figure 12:
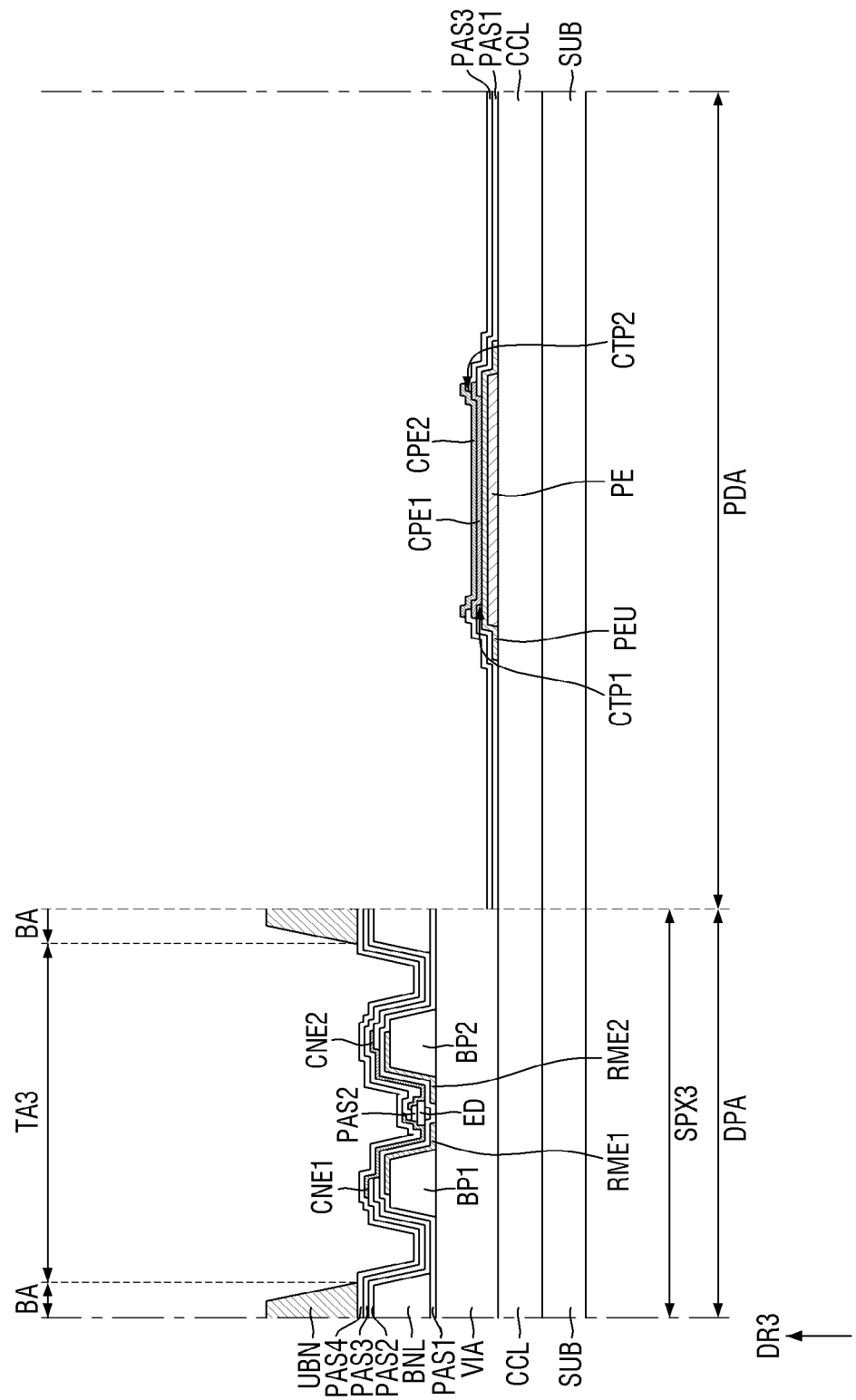

Subsequently, referring to FIG. 12, a first connection electrode CNE1 disposed in the display area DPA and a second pad electrode capping layer CPE2 disposed in the pad area PDA may be formed, and a fourth insulation layer PAS4 may be formed thereon. The first connection electrode CNE1 may be in contact with second ends of the light-emitting elements ED exposed by the third insulating layer PAS3, and the second pad electrode capping layer CPE2 may be in contact with the first pad electrode capping layer CPE1 exposed by the second pad contact portion CTP2 of the third insulating layer PAS3. The fourth insulating layer PAS4 may be disposed on the third insulating layer PAS3 and the first connection electrode CNE1, and the fourth insulating layer PAS4 may not be disposed in the pad area PDA.

Subsequently, an upper bank layer UBN may be formed on the fourth insulating layer PAS4 in the display area DPA. The upper bank layer UBN may be disposed to overlap the bank layer BNL, and may be formed in a lattice pattern.

Figure 13:
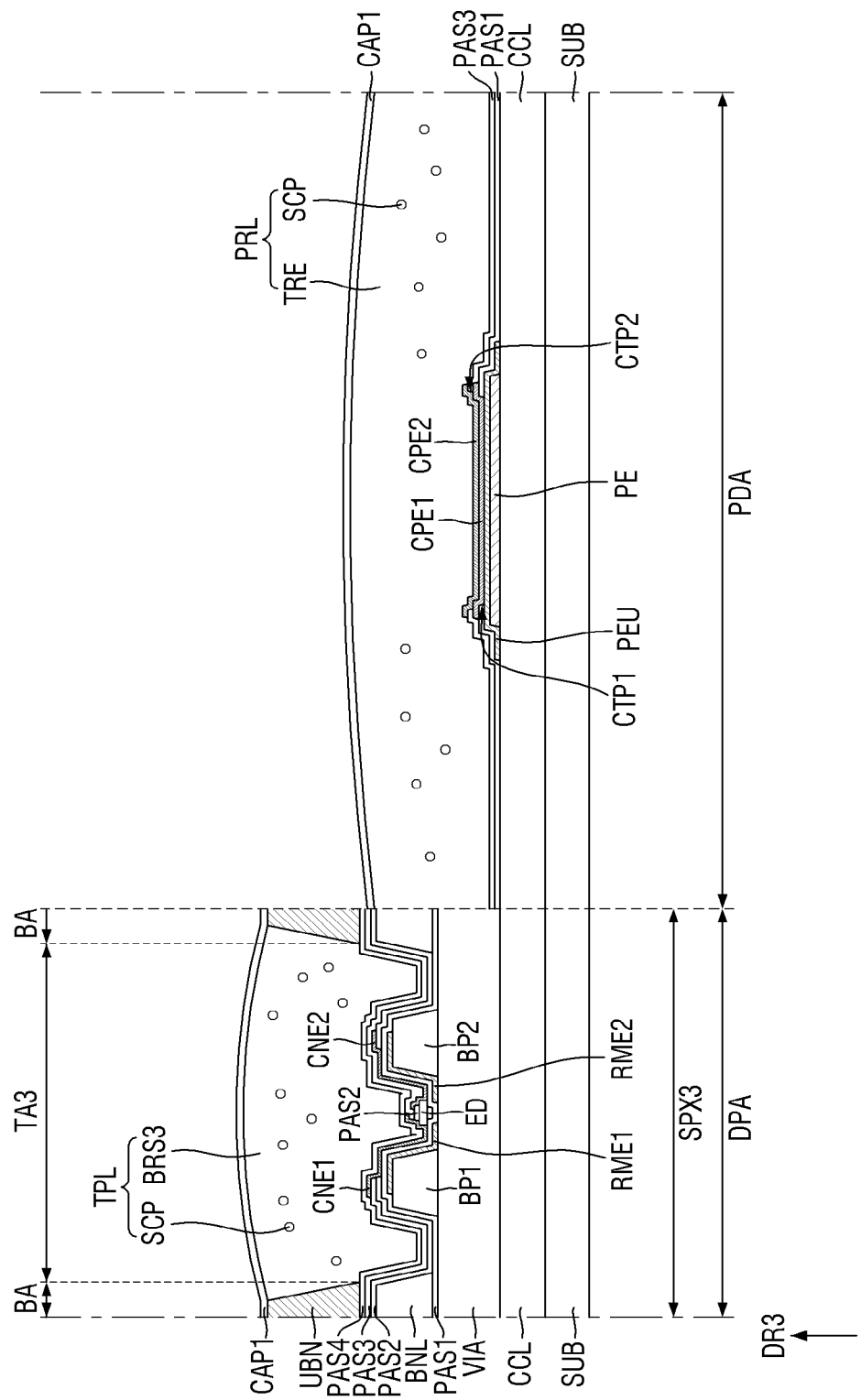

Subsequently, referring to FIG. 13, a transparent layer TPL disposed in the display area DPA and a protective layer PRL disposed in the pad area PDA may be formed. According to an embodiment of the disclosure, the transparent layer TPL and the protective layer PRL may be simultaneously formed via a patterning process. For example, the transparent layer TPL and the protective layer PRL may be formed together by coating a coating solution containing the scattering particles SCP dispersed in the polymer resin BRS3 onto the entire surface of the display area DPA and the pad area PDA, and they developing, baking and stripping it. The transparent layer TPL thus formed may include scattering particles SCP dispersed in a third base resin BRS3, and the protective layer PRL may include scattering particles SCP dispersed in a polymer resin TRE. According to an embodiment of the disclosure, the thickness of the transparent layer TPL may be equal to or different from the thickness of the protective layer PRL. For example, when the transparent layer TPL and the protective layer PRL have different thicknesses, a halftone mask may be used.

Subsequently, although not shown in the drawings, a coating solution containing scattering particles dispersed in a first base resin may be coated and patterned to form a first wavelength conversion layer. A coating solution containing scattering particles dispersed in a second base resin may be coated and patterned to form a second wavelength conversion layer. According to this embodiment, as the protective layer PRL covering the pad area PDA may be disposed, it may be possible to protect the pad area PDA during the process of patterning the first wavelength conversion layer and the second wavelength conversion layer.

Subsequently, a first capping layer CPL1 may be formed on the display area DPA and the pad area PDA. The first capping layer CPL1 may be disposed to cover the transparent layer TPL, the first wavelength conversion layer and the second wavelength conversion layer in the display area DPA, and may cover the protective layer PRL in the pad area PDA.

Figure 14:
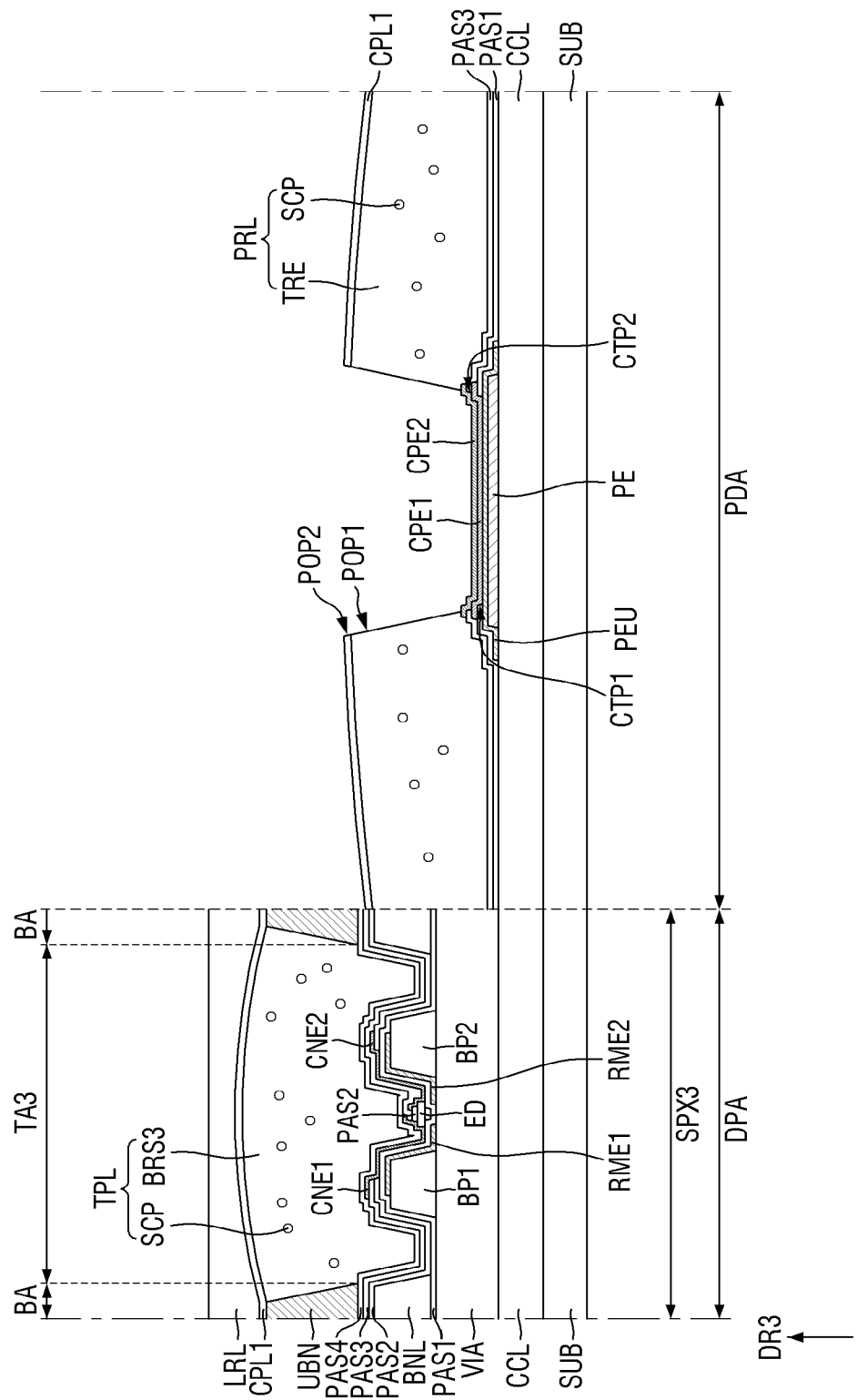

Subsequently, referring to FIG. 14, the protective layer PRL and the first capping layer CPL1 in the pad area PDA are etched together, so that a first pad opening POP1 and a second pad opening POP2 are formed which expose a portion of the upper surface of the second pad electrode capping layer CPE2. The protective layer PRL and the first capping layer CPL1 may be formed dry etching. The first pad opening POP1 may be formed by etching the protective layer PRL, and the second pad opening POP2 may be formed by etching the first capping layer CPL1.

Subsequently, a low-refractive layer LRL may be formed on the first capping layer CPL1 in the display area DPA. The low-refractive layer LRL may be formed by applying an organic material, and may be formed to cover the first capping layer CPL1. The low-refractive layer LRL may be formed entirely in the display area DPA but may not be formed in the pad area PDA.

Figure 15:
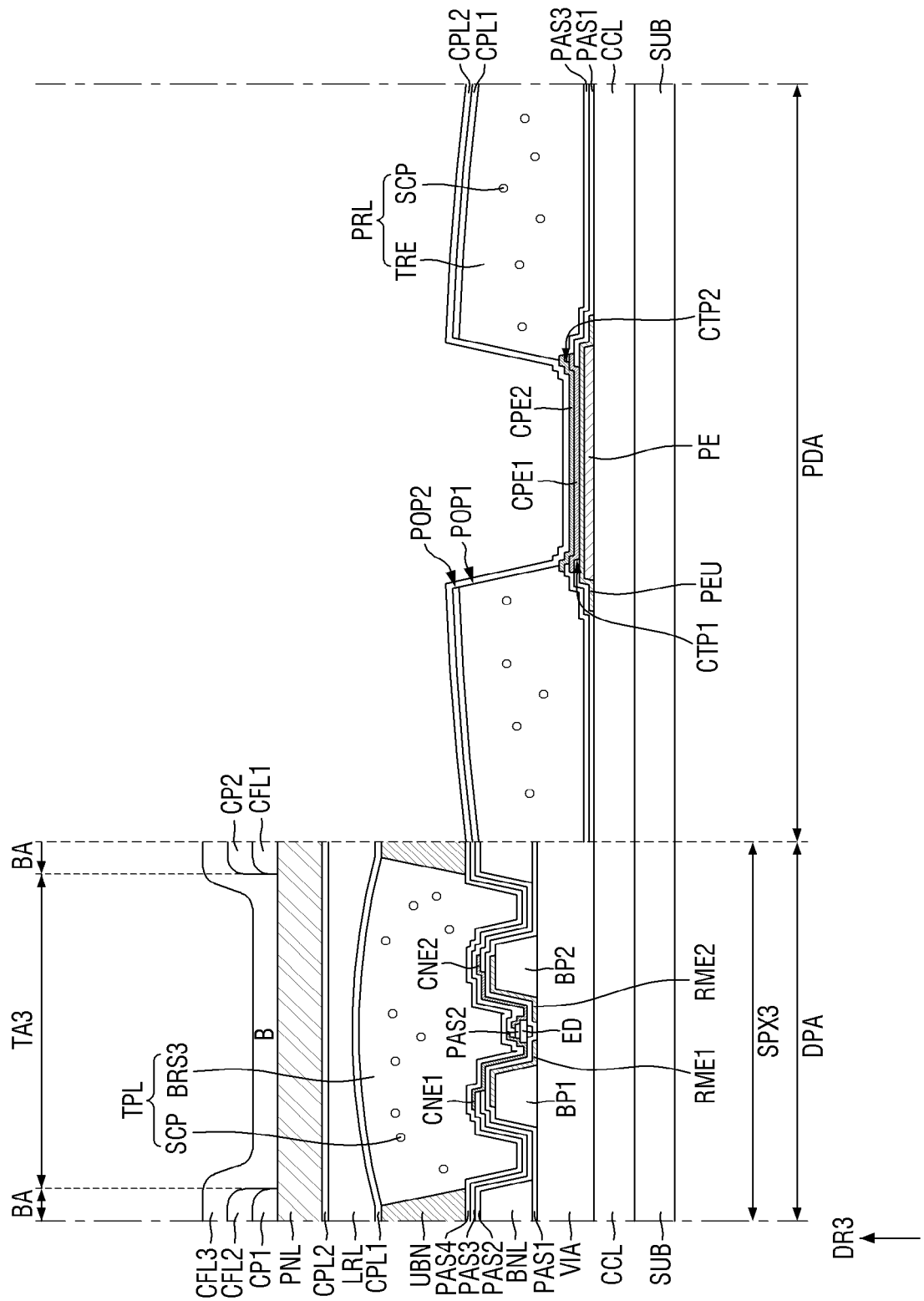

Subsequently, referring to FIG. 15, a second capping layer CPL2 may be formed in the display area DPA and the pad area PDA. The second capping layer CPL2 may cover the low-refractive layer LRL in the display area DPA, and may cover the first capping layer CPL1, the protective layer PRL and the second pad electrode capping layer CPE2 in the pad area PDA. The second capping layer CPL2 can protect the second pad electrode capping layer CPE2 during subsequent processes.

Subsequently, a planarization layer PNL, color patterns CP1 and CP2, and a color filter layer CFL may be formed on the second capping layer CPL2 in the display area DPA. The planarization layer PNL, the color patterns CP1 and CP2 and the color filter layer CFL may be formed by applying materials forming the layers and patterning them. The planarization layer PNL, the color patterns CP1 and CP2 and the color filter layer CFL may be disposed in the display area DPA but not in the pad area PDA. According to this embodiment, the second capping layer CPL2, the first capping layer CPL1 and the protective layer PRL disposed in the pad area PDA can protect the pad area PDA during the above-described processes of patterning the layers.

Figure 16:
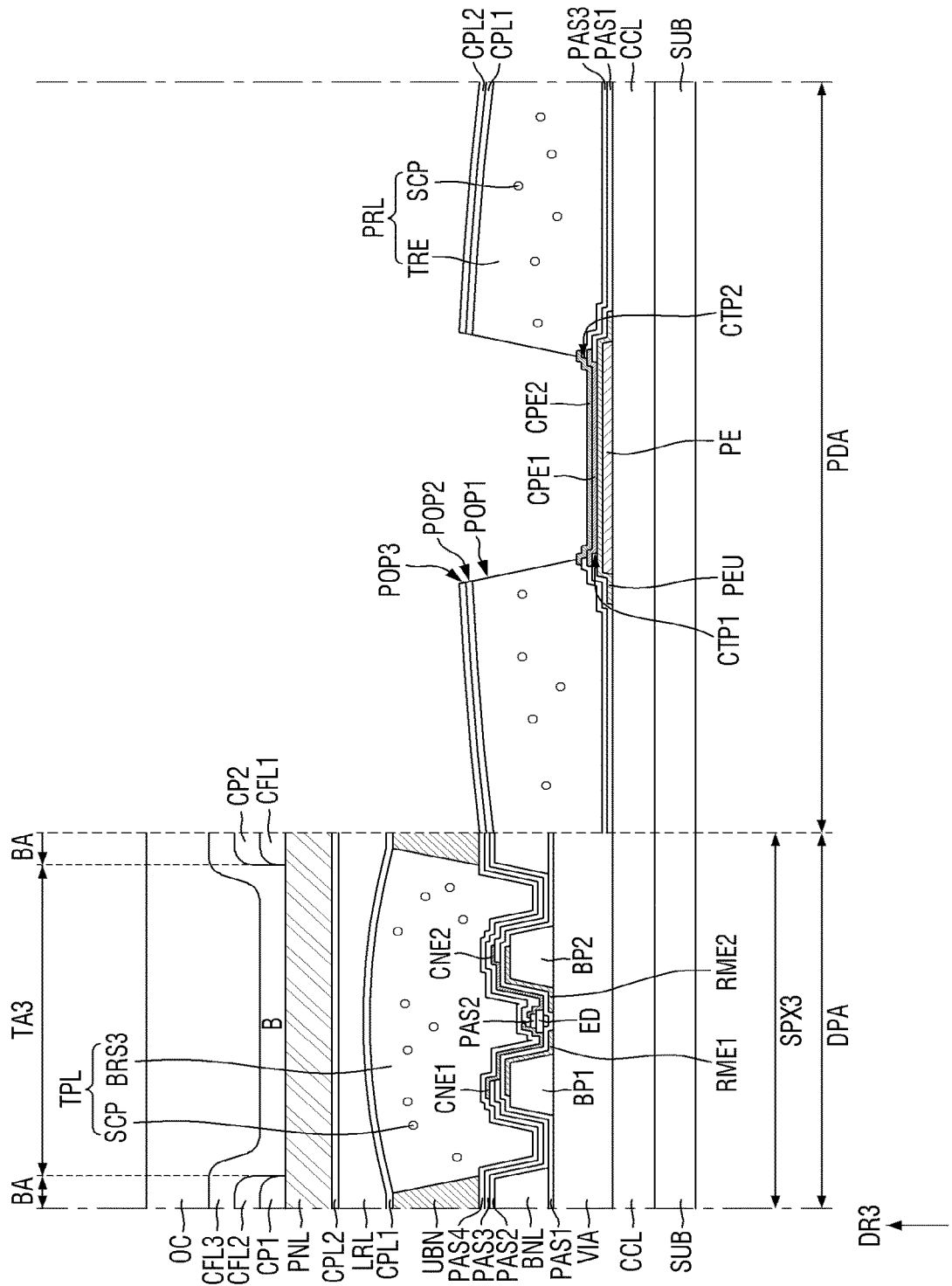

Subsequently, referring to FIG. 16, an overcoat layer OC may be formed in the display area DPA, and the second capping layer CPL2 in the pad area PDA may be etched to form a third pad opening POP3. The overcoat layer OC may be formed via a patterning process and may not be disposed in the pad area PDA. The third pad opening POP3 may be formed via a dry etching process. The third pad opening POP3 exposes a portion of the upper surface of the second pad electrode capping layer CPE2.

In this manner, the display device 10 according to an embodiment of the disclosure can be fabricated. According to this embodiment, by forming the protective layer PRL, the first capping layer CPL1 and the second capping layer CPL2 in the pad area PDA, it may be possible to prevent problems, such as galvanic corrosion, from occurring in the electrodes disposed in the pad area PDA by a developer during the processes.

In concluding the detailed description, those skilled in the art will appreciate that many variations and modifications can be made to embodiments without substantially departing from the principles of the disclosure. Therefore, the disclosed embodiments of the disclosure are used in a generic and descriptive sense only and not for purposes of limitation.

What is claimed is:

1. A display device comprising:
    a pad electrode disposed on a substrate;
    a pad electrode upper layer disposed on the pad electrode;
    a first pad electrode capping layer disposed on the pad electrode upper layer;
    a second pad electrode capping layer disposed on the first pad electrode capping layer;
    a protective layer disposed on the second pad electrode capping layer; and
    capping layers disposed on the protective layer, wherein
    the protective layer comprises a polymer resin and scattering particles, and
    the protective layer comprises a first pad opening exposing the second pad electrode capping layer.

2. The display device of claim 1, wherein
    the substrate comprises a display area and a pad area spaced apart from the display area, and
    the pad electrode is disposed in the pad area.

3. The display device of claim 2, further comprising:
    first and second electrodes that are disposed on the substrate in the display area and spaced apart from each other;
    a light-emitting element disposed on the first electrode and the second electrode;
    a first connection electrode electrically connected to a first end of the light-emitting element; and
    a second connection electrode electrically connected to a second end of the light-emitting element.

4. The display device of claim 3, wherein
    the pad electrode upper layer, the first electrode, and the second electrode include a same material,
    the first pad electrode capping layer and the first connection electrode include a same material, and
    the second pad electrode capping layer and the second connection electrode include a same material.

5. The display device of claim 3, further comprising:
a transparent layer disposed on the first connection electrode and the second connection electrode and comprising a base resin and scattering particles,
wherein the capping layers are disposed on the transparent layer.

6. The display device of claim 5, wherein
the base resin of the transparent layer and the polymer resin of the protective layer comprise a same material, and
the scattering particles of the transparent layer and the scattering particles of the protective layer comprise a same material.

7. The display device of claim 5, wherein the first capping layer and the second capping layer are extended from the display area to the pad area.

8. The display device of claim 3, further comprising:
a first insulating layer disposed between the pad electrode upper layer and the first pad electrode capping layer, wherein
the first insulating layer comprises a first pad contact portion exposing the pad electrode upper layer, and
the first pad electrode capping layer is in contact with the pad electrode upper layer via the first pad contact portion.

9. The display device of claim 8, further comprising:
a second insulating layer disposed between the first pad electrode capping layer and the second pad electrode capping layer, wherein
the second insulating layer comprises a second pad contact portion that exposes the first pad electrode capping layer and overlaps the first pad contact portion, and
the second pad electrode capping layer is in contact with the first pad electrode capping layer via the second pad contact portion.

10. The display device of claim 9, wherein
the first insulating layer is disposed between the first and second electrodes and the light-emitting element,
the second insulating layer is disposed between the first connection electrode and the second connection electrode, and
the first insulating layer and the second insulating layer are extended from the display area to the pad area.

11. The display device of claim 1, wherein
the capping layers comprises a first capping layer disposed on the protective layer and a second capping layer disposed on the first capping layer,
the first capping layer comprises a second pad opening exposing the second pad electrode capping layer, and
the second capping layer comprises a third pad opening exposing the second pad electrode capping layer.

12. The display device of claim 11, wherein the second pad opening and the third pad opening overlap the first pad opening.

13. The display device of claim 11, wherein side surfaces of the protective layer, side surfaces of the first capping layer, and side surfaces of the second capping layer are aligned with one another.

14. A method of fabricating a display device, the method comprising:
preparing a substrate comprising a display area and a pad area;
forming a pad electrode on the substrate in the pad area;
forming a first electrode and a second electrode on the substrate in the display area;
forming a pad electrode upper layer on the pad electrode;
forming a first insulating layer on the first electrode, the second electrode, and the pad electrode upper layer;
forming a light-emitting element on the first electrode and the second electrode;
forming a first connection electrode in contact with a first end of the light-emitting element;
forming a first pad electrode capping layer on the pad electrode upper layer;
forming a second insulating layer on the first connection electrode and the first pad electrode capping layer;
forming a second connection electrode in contact with a second end of the light-emitting element;
forming a second pad electrode capping layer on the first pad electrode capping layer;
forming a transparent layer on the second connection electrode;
forming a protective layer on the second pad electrode capping layer;
forming a first capping layer on the transparent layer and the protective layer; and
forming a second capping layer on the first capping layer.

15. The method of claim 14, wherein the transparent layer and the protective layer are formed simultaneously by applying a coating solution containing a polymer resin and scattering particles dispersed in the polymer resin and patterning the coating solution.

16. The method of claim 14, further comprising:
after the forming of the first insulating layer, forming a first pad contact portion exposing the pad electrode upper layer by etching the first insulating layer.

17. The method of claim 16, further comprising:
after the forming of the second insulating layer, forming a second pad contact portion exposing the first pad electrode capping layer by etching the second insulating layer.

18. The method of claim 17, further comprising:
after the forming of the first capping layer, forming a first pad opening and a second pad opening exposing the second pad electrode capping layer by etching the protective layer and the first capping layer altogether.

19. The method of claim 18, wherein
the second capping layer covers the first capping layer, and
the second capping layer covers the protective layer and the second pad electrode capping layer through the first pad opening and the second pad opening.

20. The method of claim 19, further comprising:
after the forming of the second capping layer, forming a third pad opening exposing the second pad electrode capping layer by etching the second capping layer.

* * * * *